(12) United States Patent
Nishihara et al.

(10) Patent No.: US 7,385,863 B2
(45) Date of Patent: Jun. 10, 2008

(54) SEMICONDUCTOR MEMORY DEVICE

(75) Inventors: Toshiyuki Nishihara, Kanagawa (JP); Yoshio Sakai, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/716,710

(22) Filed: Mar. 12, 2007

(65) Prior Publication Data

US 2007/0165468 A1 Jul. 19, 2007

Related U.S. Application Data

(63) Continuation of application No. 11/000,048, filed on Dec. 1, 2004, now Pat. No. 7,248,514.

(30) Foreign Application Priority Data

Dec. 11, 2003 (JP) ............................. 2003-413160

(51) Int. Cl.
*G11C 7/00* (2006.01)
*G11C 8/00* (2006.01)
*H03K 19/003* (2006.01)

(52) U.S. Cl. .................... 365/200; 365/230.03; 236/10
(58) Field of Classification Search ................ 365/200, 365/230.03; 326/10
See application file for complete search history.

(56) References Cited

U.S. PATENT DOCUMENTS

| | | | |
|---|---|---|---|
| 4,601,031 A | | 7/1986 | Walker et al. |
| 4,752,914 A | * | 6/1988 | Nakano et al. ............. 365/200 |
| 4,803,656 A | * | 2/1989 | Takemae ..................... 365/200 |
| 5,195,057 A | * | 3/1993 | Kasa et al. .................. 365/200 |
| 5,278,793 A | * | 1/1994 | Yeh ............................ 365/200 |
| 5,596,535 A | * | 1/1997 | Mushya et al. ............. 365/200 |
| 5,617,365 A | * | 4/1997 | Horiguchi et al. .......... 365/200 |
| 5,781,717 A | * | 7/1998 | Wu et al. ....................... 714/8 |
| 5,796,653 A | * | 8/1998 | Gaultier ................. 365/185.09 |
| 5,815,453 A | * | 9/1998 | Matsui ........................ 365/210 |

(Continued)

FOREIGN PATENT DOCUMENTS

| | | |
|---|---|---|
| JP | 02-195598 | 8/1990 |
| JP | 04-228196 | 8/1992 |
| JP | 06-020494 | 1/1994 |
| JP | 08-083497 | 3/1996 |
| JP | 11-120788 | 4/1999 |
| JP | 2000-163988 | 6/2000 |

OTHER PUBLICATIONS

Japanese Office Action; Application No.: 2003-413160; Date issued: Aug. 28, 2007.

*Primary Examiner*—Ly D Pham
(74) *Attorney, Agent, or Firm*—Rader Fishman & Grauer PLLC; Ronald P. Kananen

(57) ABSTRACT

A semiconductor memory device enabling efficient repair of defects by using limited redundant memory while suppressing a drop of access speed accompanied with the repair of defects of the memory, wherein a first memory array is divided into a plurality of memory regions for each 16 word lines and wherein defective memory addresses in regions are stored in a second memory array. When a memory address for accessing the first memory array is input, the defective memory address of the memory region including the memory to be accessed is read out from the second memory array. In this way, the addresses of defective memory in 16 word lines worth of a memory region are stored in the second memory array 2, therefore addresses of a wider range of defective memory can be stored. For this reason, it becomes possible to repair defects occurring at random efficiently.

9 Claims, 12 Drawing Sheets

U.S. PATENT DOCUMENTS

| | | | |
|---|---|---|---|
| 5,862,086 A * | 1/1999 | Makimura et al. | 365/200 |
| 6,590,815 B2 | 7/2003 | Mine | |
| 6,697,289 B1 * | 2/2004 | Yamamoto | 365/200 |
| 7,016,215 B2 * | 3/2006 | Kamoshida et al. | 365/145 |
| 2001/0030896 A1 * | 10/2001 | Ooishi | 365/200 |
| 2003/0107931 A1 * | 6/2003 | Dono | 365/201 |
| 2003/0177415 A1 * | 9/2003 | Togashi et al. | 714/30 |
| 2004/0184329 A1 | 9/2004 | Horiguchi et al. | |

* cited by examiner

SEMICONDUCTOR MEMORY DEVICE

CROSS REFERENCE TO RELATED APPLICATIONS

The present application is a Divisional Application of the patent application Ser. No.: 11/000,048, filed Dec. 1, 2004, which is based on the priority application JP-2003-413160 filed on Dec. 11, 2003, the entire contents of which are incorporated herein by reference.

The present application is a Continuation application of the patent application Ser. No. 11/000,048, filed Dec. 01, 2004, now Pat. No. 7,248,514, which is based on the priority application JP-2003-413160 filed on Dec. 11, 2003, the entire contents of which are incorporated herein by reference.

BACKGROUND OF THE INVENTION

1. Field of the Invention

The present invention relates to a semiconductor memory device having the function of switching access to defective memory in a memory array to access to redundant memory provided in advance.

2. Description of the Related Art

In recent years, advances in semiconductor miniaturization technology have led to remarkable advances in the increase of capacity of semiconductor memories. On the other hand, however, a signal generated from a miniature memory cell becomes very weak, so the statistical probability of occurrence of cell defects accompanied with variations in the production process becomes high.

Defects of memory cells are generally dealt with by referring to a defect map describing addresses etc. of the defective cells for each repair unit. Conventionally, the defect map is programmed in fuses etc. provided inside the semiconductor memory. Defective cells and redundant cells are exchanged based on this defect map. Defective cells and redundant cells are frequently exchanged for entire large groups such as word line units and bit line units. However, many statistical cell defects explained above occur at random in small units. Therefore, too many fuses and redundant cells must be prepared with the method of using large repair units and not all of the defects can be repaired.

In order to deal with such a problem, the technique has been proposed of using a defect map stored in a nonvolatile memory etc. provided in the chip so as to reduce the repair units to the units of bits, bytes, and words.

For example, there is the technique of individually providing a data cell array, a redundant cell array, and a defect address memory portion. The defect address memory portion stores addresses of rows and columns for specifying defective cells in the data cell array. When one of the plurality of defect addresses stored in the defect address memory portion coincides with the input address, the redundant cell corresponding to the coinciding defect address is selected and accessed in place of the defective cell. Due to this, the defective cells in the data cell array are replaced by memory cells in the redundant cell array in units of bits.

However, when preparing a defect map common to the entire memory area in this way and trying to repair random defects based on this, it is necessary to scan all addresses stored in the defect address memory portion and repair the cells of the addresses coinciding with the input addresses. This does not become a major problem when there are few defects, but when a large amount of defects occur, it becomes necessary to mount a comparison circuit for each of the large number of defect addresses, so an enormous number of comparison circuits become necessary. Accordingly, this technique is not preferred both from the viewpoints of the occupied circuit area and the comparison and search time.

Contrary to this, the technique has also been proposed of dividing the memory area in accordance with the addresses and providing a defect map for repairing random defects for each divided section. Each defect map includes information for specifying the defective cells limited to the corresponding section. The defect map corresponding to the section of access target can be selected by decoding an input address. According to this technique, each defect map can be reduced in scale, so a reduction of the comparison circuit and a shortening of the delay time can be achieved.

For example, there is a technique of converting the input addresses to index parts and tag parts and dividing the memory area by using the index parts. According to this technique, there is provided a defect repair memory separately from the main memory. The defect repair memory stores the defect maps and provides redundancy memory cells. When an address is input to the memory device, the input address is converted to an index part and tag part, then the defect map corresponding to the index part is selected by decoding the index part and the selected defect map is read out from the defect repair memory. Then, the defective memory cell is specified by referring to the read defect map and the tag part.

Japanese Unexamined Patent Publication (Kokai) No. 11-120788 proposes a configuration providing redundant cells and the defect map storage cells as sets on the same rows in the memory array in addition to the data cells. In Japanese Unexamined Patent Publication (Kokai) No. 11-120788, one row in the memory array can be regarded as a memory region corresponding to the section or index part. When a row of the memory is selected according to a row address of the input address, the defect map corresponding to that row is simultaneously selected, and the defect location in the row is specified. By this, it becomes possible to repair random defects for each row.

Summarizing the problems to be solved by the invention, the repairing method of defective memory cells explained above is effective as a basic concept, but when applying it to an actual memory chip, there are the following disadvantages.

For example, in the technique of converting input addresses to index parts and tag parts, the conversion is only "performed so as to optimize the repair efficiency". Namely, index parts can be physically linked with word line selection addresses of the defect repair memory, but the physical link between the defect repair memory and the main memory remains in an arbitrary state.

As a result, an access operation to the main memory and the defect repair memory are not related to each other and synchronized, but completely independently. Accordingly, whenever an address for accessing the main memory is input from the outside, the input address must be converted to an index part and a tag part, the word line of the defect repair memory corresponding to the index part must be selected, and the data must be read out from the defect repair memory by activating a sense amp circuit thereof.

On the other hand, when the main memory is for example a DRAM, the random access is carried out at a relatively low speed, but the random access and burst access of the CAS (column address strobe) performed after activating a word line are carried out at an extremely high speed. Further, the same high speed access is possible also in a relatively low speed flash memory etc. In general, the technique of selecting the row address and outputting data groups read out from the memory cells on the same word line to a latch circuit in parallel, then accessing the data groups of the latch circuit at a high speed according to the column address is used in various memories.

Accordingly, when using such a high-speed access mode, the word line is not selected in the main memory. On the other hand, in the defect repair memory, the index conversion, the row selection, the defect map reading, and the judgment of coincidence of the address and the map are executed by the usual routines. As a result, there is the disadvantage that the output from the defect repair memory and the comparison judgment following it are no longer in time for the access operation of the main memory.

In the technique of Japanese Unexamined Patent Publication (Kokai) No. 11-120788, the row addresses of the data memory cells and the index parts directly correspond, therefore when a row address is given, the data memory cell, the defect map storage cell, and the redundant memory cell connected to same row line become accessible simultaneously. Accordingly, it is also easy to handle the above high speed access mode.

In the technique according to Japanese Unexamined Patent Publication (Kokai) No. 11-120788, however, the memory groups (sets of the defect map storage cells and the redundant memory cells) are directly allocated to the word lines, therefore there is the disadvantage that wasteful memory groups not contributing to the repair of defects increase and the repair efficiency becomes low. Further, due to the restriction in chip area, the number of the memory groups which can be allocated to each word line by the present technique is expected to be no more than about one or two sets, therefore there also exists the disadvantage that repair becomes impossible when more than that many defective cells are included on the same word line.

Further, when using the technique explained above to repair defects before shipping, the write operation of data of the defect map etc. for specifying a defect location is very troublesome.

Namely, a large amount of defect locations must first be detected by a function test using various test patterns, the data must be once collected and stored at the outside of the memory device under test, then it must be written into a defect map storage device corresponding to each memory device. Such a defect repair process requires enormous time and cost. Further, when storing defect maps in the same chip, the write operation of the defect maps is completely different from the write operation of usual data. Accordingly, it becomes necessary to provide special I/O pins for the defect maps and to perform a special operation mode for transferring the detect maps.

Further, in this repairing method of memory defects, there also exists the disadvantage that defects occurring due to aging of devices etc. after shipping cannot be handled.

SUMMARY OF THE INVENTION

An object of the present invention is to provide a semiconductor memory device capable of efficiently repairing defects by using limited redundant memory while suppressing any drop in the access speed accompanying repair of defects of the memory.

According to a first aspect of the present invention, there is provided a semiconductor memory device comprising a first memory array, a second memory array for storing a plurality of defective memory addresses, each of which corresponds to each of a plurality of memory regions obtained by dividing the first memory array for one or more word lines and designates a defective memory included in the corresponding memory region, a controlling unit for reading the defective memory address of the memory region including a first memory on the first memory array from the second memory array when a memory address for accessing the first memory is input, at least one redundant memory, and an access switching unit for specifying a defective memory according to the defective memory address read out from the second memory array and switching an access operation so that the redundant memory is accessed instead of the specified defective memory.

Preferably, the first aspect of the present invention further comprises a plurality of redundant memories, each of which corresponds to the each memory region on the first memory array and becomes accessible when a memory address for accessing a memory included in the corresponding memory region is input, and the controlling unit executes processing for reading data from the first memory array, the second memory array, and the redundant memory in parallel when the memory address for accessing a memory on the first memory array is input.

Preferably, the access switching unit judges whether or not an input memory address is an address of defective memory according to a comparison between the input memory address and a defective memory address read out from the second memory array in accordance with the input memory address, and switches an access operation so that the redundant memory is accessed instead of a defective memory when judging that the input memory address is an address of the defective memory.

According to a second aspect of the invention, there is provided a semiconductor memory device comprising a first memory array, a second memory array for storing information to specify a defective memory included in each of a plurality of memory regions obtained by dividing the first memory array, at least one redundant memory, a access switching unit for specifying defective memory according to the information stored in the second memory array and switching an access operation so that the redundant memory is accessed instead of the specified defective memory, a defect detecting unit for detecting defective memory of the first memory array by detecting errors of the read data obtained after the switching of a read operation on the access switching unit, and a controlling unit for updating the information stored in the second memory array according to the detection results of the detecting unit.

According to a third aspect of the invention, there is provided a semiconductor memory device comprising a memory array, at least one first redundant memory which can replace memory on the memory array, a first data storing unit for storing information for specifying defective memory included in the memory array, an first access switching unit for specifying defective memory according to the information stored in the first data storing unit and switching an access operation so that the first redundant memory is accessed instead of the specified defective memory, a defect detecting unit for detecting the defective memory included in the memory array according to a comparison between data read from the memory array and input data, and a controlling unit for reading data stored in memory on the memory array in a predetermined sequence when a predetermined signal instructing the start of a defect detection operation is input and updating the information stored in the first data storing unit according to the detection results of the defect detecting unit.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, an explanation will be given of embodiments of the present invention with reference to the drawings.

First Embodiment

Figure 1:
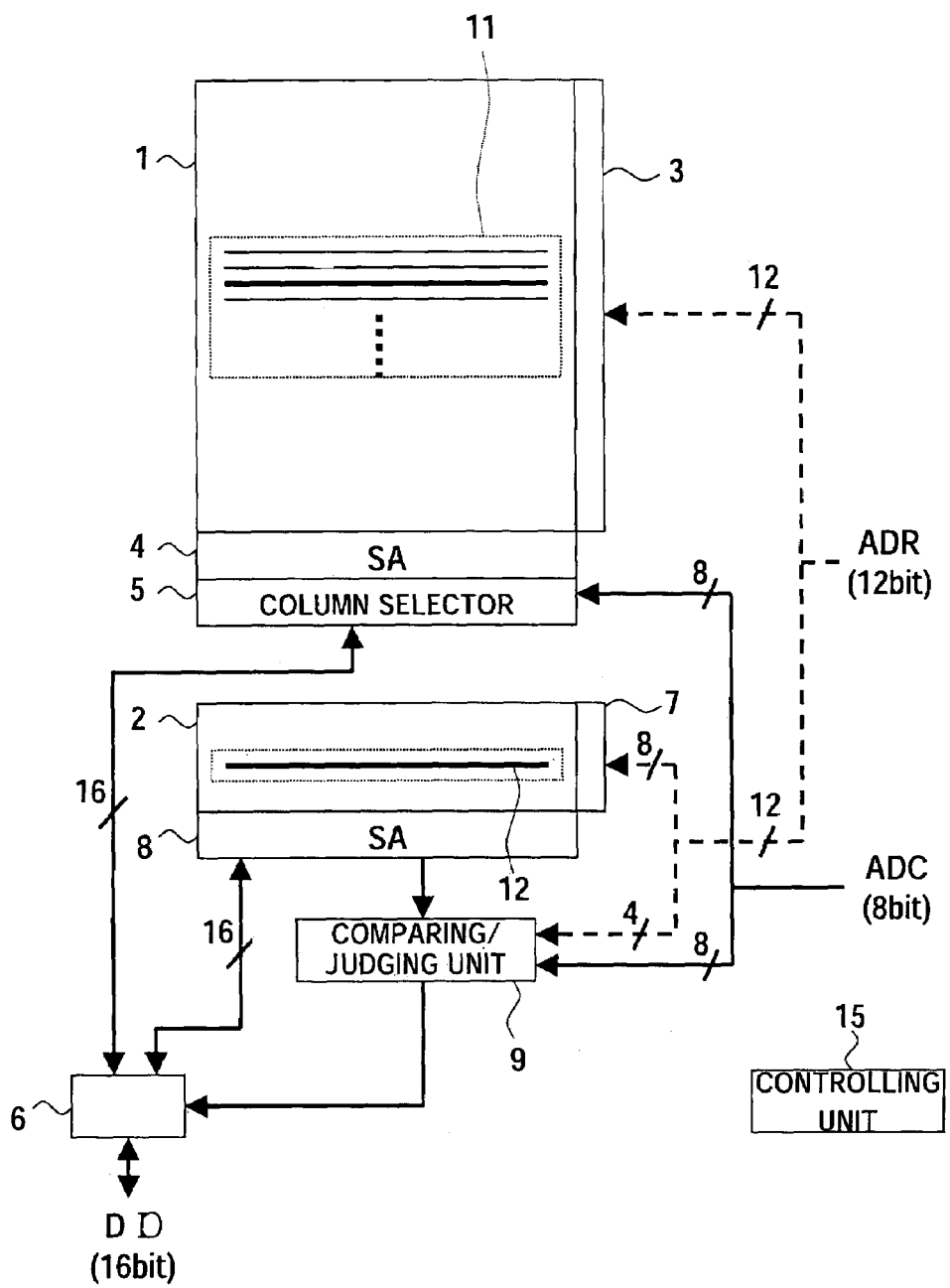
FIG. 1 is a block diagram of an example of the configuration of a semiconductor memory device according to a first embodiment of the invention.

FIG. 1 is a block diagram of an example of the configuration of a semiconductor memory device according to a first embodiment of the present invention.

The semiconductor memory device illustrated in FIG. 1 has a first memory array 1 and a second memory array 2, row decoder 3 and 7, a column selector 5, sense amplifiers 4 and 8, a comparing/judging unit 9, a selector 6, and a controlling unit 15. The first memory array 1 is an embodiment of the first memory array in the first aspect of the invention. The second memory array 2 is an embodiment of the second memory array in the first aspect of the invention. The unit including the comparing/judging unit 9 and the selector 6 is an embodiment of the access switching unit in the first aspect of the invention. The controlling unit 15 is an embodiment of the controlling unit in the first aspect of the invention.

The first memory array 1 is the main memory portion of the present semiconductor memory device including usually used memories. In the example of FIG. 1, there are 16 bits of memory at each of the $2^{12} \times 2^8$ number of addresses indicated by 12 bits of row address ADR and 8 bits of column address ADC. Accordingly, the first memory array 1 in the present example has a storage capacity of $2^{12} \times 2^8 \times 16 = 16$ Mbits.

The row decoder 3 selects a word line to be accessed in the first memory array 1 in accordance with an input 12 bits of row address ADR. The row decoder 7 selects the word line to be accessed in the second memory array 2 in accordance with 8 bits of address in the input 12 bits of row address ADR.

The sense amplifier 4 reads and writes data with respect to a memory cell via each bit line of the first memory array 1. The sense amplifier 8 reads and writes data with respect to a memory cell via each bit line of the second memory array 2.

The column selector 5 selects one word's (16 bits') worth of memory from among one row's worth of memory of the first memory array 1 accessed via the sense amplifier 4 in accordance with an input 8 bits of column address ADC.

The second memory array 2 has a plurality of memory groups. Each memory group have a redundant memory for replacing defective memory existing in the first memory array 1, a memory for storing an address (defective memory address) for specifying defective memory, and a memory for storing flag data indicating whether or not a defective memory address is valid as a set.

For example, the second memory array 2 has $2^8$ number of word lines, each of which is indicated by 8 bits of address in 12 bits of row address ADR and has the above memory group.

Accordingly, if the 8 bits of address input to the row decoder 7 are equal among two different row addresses ADR, even if the remaining 4 bits are different among there, the same word line is selected for the two row addresses ADR at the row decoder 7. In other words, one word line 12 in the second memory array 2 and 16 word line groups 11 in the first memory array 1 are in a one-to-one correspondence. When any word line of the word line group is selected by the row decoder 3, the common word line corresponding to this word line group is selected at the row decoder 7, and the memory group connected to the selected word line thereof becomes accessible.

In this way, the second memory array 2 has plurality of memory groups, each of which corresponding to each of the plurality of memory regions obtained by dividing the first memory array 1 for each 16 word lines.

Figure 2:
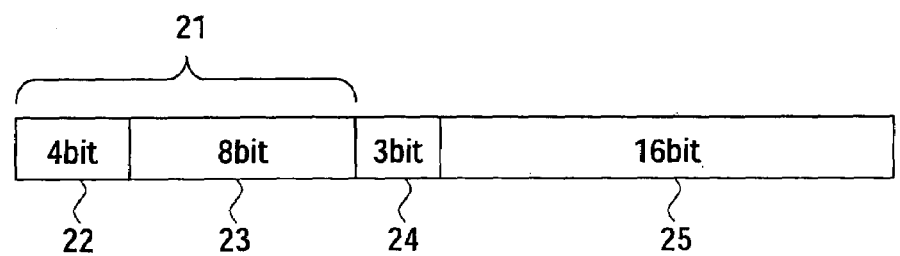
FIG. 2 is a view illustrating an example of the configuration of a memory group according to the first embodiment.

FIG. 2 is a view illustrating an example of the configuration of a memory group of the second memory array 2. For example, as shown in FIG. 2, a memory group has 12 bits of memory for storing a defective memory address 21, 3 bits of memory for storing flag data 24, and 1 word (16 bits) of redundant memory.

A "defective memory address 21" is an address for specifying defective memory in a memory region corresponding to a word line group 11 and includes two addresses 22 and 23. The address 22 is the 4 bits of address excluding the 8 bits of address input to the row decoder 7 in a row address ADR. The address 22 specifies one among the 16 bits of word lines in the word line group 11. The address 23 is the 8 bits of column address and specifies one word of memory on one word line.

The flag data 24 indicates whether or not the defective memory address 21 of this memory group is valid. Namely, when this data flag 24 is valid, it indicates that there is defective memory to be repaired at the defective memory address 21, while when the data flag 24 is not valid, it indicates that there is no defective memory to be repaired at the address.

Further, as shown in FIG. 2, the flag data 24 is stored at the 3 bits of memory cells. When two or more bits among 3 bits are "1", the flag data 24 is regarded as valid in the comparing/judging unit 9 explained later. A minimum bit length for indicating valid/invalid is 1 bit. However, if a defect occurs in the storage memory of the flag data, a fatal malfunction is liable to be induced. Therefore, in the present example, the flag data 24 is made 3 bits and the valid/invalid judgment is carried out by a majority decision. Due to this, the probability of occurrence of malfunction due to mistaken judgment of the flag data can be suppressed.

The defective memory addresses 21 and the flag data 24 must be constantly held irrespective of the on/off state of the power supply. For this reason, preferably the second memory array 2 is a nonvolatile memory such as a ferroelectric memory. When configuring the second memory array 2 by a volatile memory, for example, these data can be loaded from nonvolatile memories separately provided inside and outside the chip.

The comparing/judging unit 9 compares the 4 bits of address excluding the 8 bits of address input to the row decoder 7 in a row address ADR and a addresses 22, and compares the 8 bits of column address ADC and a address 23, when the data stored in memory group corresponding to the row address ADR is output from sense amplifier 8.

Further, it judges whether or not 2 bits or more in the 3 bits of flag data 24 is "1", that is, whether or not the flag data 24 indicates that the defective memory addresses 21 is valid.

Then, when these addresses coincide and the flag data 24 is valid in state, the comparing/judging unit 9 judges that the input address (ADR, ADC) is an address of defective memory. Conversely, when the two addresses do not coincide or the flag data 24 is not valid in state, it judges the input address (ADR, ADC) is an address of a normal memory not defective memory.

The selector 6 selects the data of the first memory array 1 input and output via the column selector 5 or data 25 of redundant memory input and output via the sense amplifier 8 in accordance with the judgment result of the comparing/judging unit 9. Namely, where the input address is judged as an address of defective memory, the input/output lines of the sense amplifier 8 for transmitting the data 25 of redundant memory is connected to the data bus DIO. When the input address is judged as the address of normal memory, the input/output lines of the column selector 5 of the first memory array 1 is connected to the data bus DIO.

The controlling unit 15 performs various controls relating to the overall operation of the semiconductor memory device. For example, when a row address ADR and column address ADC are input and a predetermined control signal instructing writing or reading of data is input, the controlling unit 15 performs control for the selection of word lines in the row decoders 3 and 7, the data read operation from the bit lines in the sense amplifiers 4 and 8, etc. at suitable timings.

Here, an explanation will be given of the semiconductor memory device shown in FIG. 1 having the above configuration by referring to the flow chart shown in FIG. 3.

Steps ST10 and ST11

A row address ADR and a column address ADC are input together with a predetermined control signal instructing the writing or reading of data, whereupon, based on the control of the controlling unit 15, a selecting operations of word lines in the row decoders 3 and 7 are executed in parallel.

Steps ST12 and ST13

The data of the memory cells connected to the word lines selected by the row decoders 3 and 7 are read out to the bit lines, amplified at the sense amplifiers 4 and 8, and latched in value. Due to this, the data of the memory cells on the word lines corresponding to the row address ADR are acquired from the first memory array 1, and the data of the memory groups corresponding to the row address ADR are acquired from the second memory array 2.

In general, the access operation to the semiconductor memory takes the longest time in this data sensing process. But according to the semiconductor memory device shown in FIG. 1, the operations of the data sensing process in the first memory array 1 and the second memory array 2 can be synchronized and performed in parallel without any special conversion for the input addresses. For this reason, the delay of the access time accompanied with repair of defects is suppressed to the lowest limit.

Steps ST14 and ST15

The data acquired from the first memory array 1 is input to the column selector 5, and 1 word of data in accordance with the column address ADC is selected from among the data. In parallel to this operation, among the data acquired from the second memory array 2, the defective memory address 21 and the flag data 24 are input to the comparing/judging unit 9. Then, the address 23 in the defective memory address 21 is compared with the column address ADC, and the address 22 is compared with part (4 bits) of the row address ADR. Further, it is judged whether or not the flag data 24 is valid in state in accordance with the number of bits of "1" included in the 3 bits of the flag data 24.

Step ST16

When the defective memory addresses 22 and 23 acquired from the second memory array 2 and the input address coincide and the flag data 24 is valid in state, it is judged that the input address is an address of defective memory. In this case, the input/output lines of the sense amplifier 8 are connected to the data bus DIO in the selector 6 so that an access operation to the specified defective memory is switched to an access operation to the redundant memory 25. On the other hand, when it is judged that the input address is an address of normal memory, the input/output lines of the column selector 5 is connected to the data bus DIO at the selector 6 so that normal memory on the first memory array 1 is accessed.

Step ST17

When the connection of the selector 6 has been finalized, the reading and writing with respect to the memory of the first memory array 1 or the second memory array 2 are carried out.

As explained above, according to the semiconductor memory device shown in FIG. 1, the first memory array 1 is divided into a plurality of memory regions for each 16 word lines, and the defective memory addresses in the regions are stored in the second memory array 2. When a memory address for accessing the first memory array 1 is input, the defective memory addresses of the memory region including the memory to be accessed are read out from the second memory array 2.

In this way, the addresses of defective memory existing in 16 word lines' worth of the memory regions are stored in the second memory array 2. Therefore, in comparison with the case where only one word line's worth of a memory region can be covered by one defective memory address as disclosed in for example Japanese Unexamined Patent Publication (Kokai) No. 11-120788, addresses of broader ranges of defective memory can be stored. For this reason, it becomes possible to repair defects occurring at random efficiently.

Further, the above memory regions of the first memory array 1 are regions divided for each word line. For this reason, the parts of the row addresses ADR concerned with the selection of word lines in the input addresses can be directly used for accessing a memory group on the second memory array 2 and reading out data from the memory groups. Accordingly, in comparison with the case of converting or otherwise processing the input address, it becomes possible to read out defective memory addresses or other data from the second memory array 2 at a high speed and suppress a drop in the access speed accompanied with repair of defects.

Figure 3:
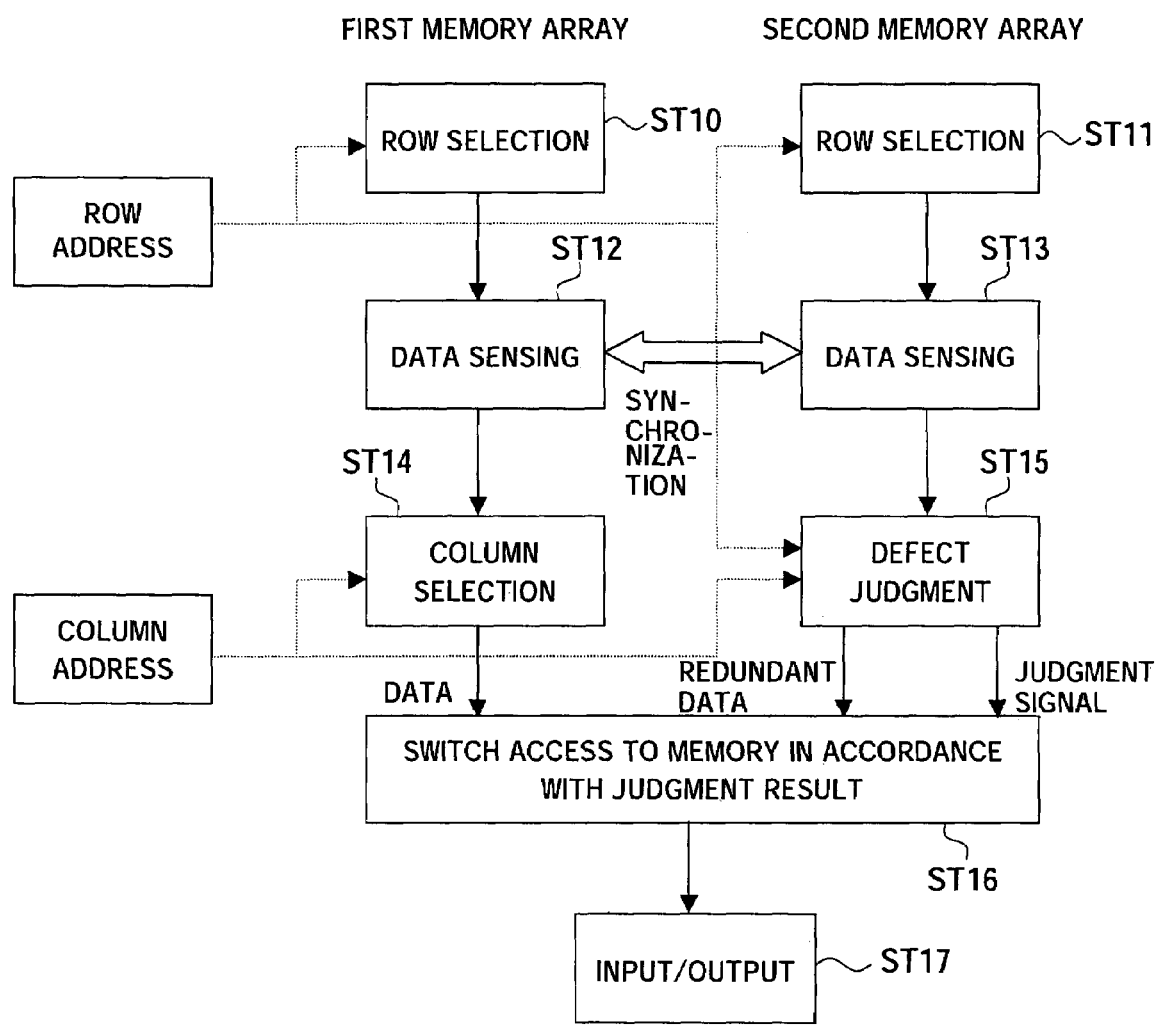
FIG. 3 is a flow chart for explaining an example of the operation of the semiconductor memory device shown in FIG. 1.

In addition, when an address (ADR, ADC) for accessing the first memory array is input, as shown in FIG. 3, the read operation to the first memory array 1 and the second memory array 2 are executed in parallel.

In this way, the read accesses from memory requiring the longest access time are carried out in parallel in two memory arrays, so the drop of the access speed accompanying repair of defects can be more effectively suppressed.

DRAMs, SRAMs, flash memories, ferroelectric memories, magnetic memories, and many other semiconductor memories have high speed access modes where they perform the processing up to the data sensing process (steps ST12 and ST13 of FIG. 3), then repeat the following accesses while changing only the column address by an internal counter or external control. According to the semiconductor memory-device shown in FIG. 1, the selection of the memory group and data sensing in the second memory array 2 and the row selection and data sensing in the first memory array 1 are executed in parallel, so it is possible to complete the two data sensing processes at the same timing. Namely, at the stage of repeating the steps after the data sensing, it is not necessary to repeat the data sensing of the memory groups, therefore, even in the high speed access mode explained above, the repair of defects can be realized while suppressing a drop of the access speed.

Some large capacity memories, however, reduce the load of the bit lines and the power consumption by finely dividing the memory into a plurality of arrays. In a semiconductor memory having such a configuration, the array is first selected, and then the word line in the array is selected. The address used for this array selection can be regarded as part of the row address in the present invention.

Further, in memory of a type dividing in the word line direction, word lines of a plurality of arrays activate synchronously together in a one-to-one correspondence. The case of such a memory is essentially the same as that of a single array in the point that the row selection is alternately carried out.

The memory of such an array division type can be applied to both of the first memory array 1 and the second memory array 2. The semiconductor memory device of the present embodiment operates in the same way as that described above irrespective of such an array division and can exhibit the same effects.

Further, there is also a memory wherein a plurality of banks are provided on the same semiconductor chip, and word lines corresponding to different row addresses is activated in parallel, but in the case of such a memory, explained above, the repair of defects can be realized while suppressing a drop of the access speed.

Some large capacity memories, however, reduce the load of the bit lines and the power consumption by finely dividing the memory into a plurality of arrays. In a semiconductor memory having such a configuration, the array is first selected, and then the word line in the array is selected. The address used for this array selection can be regarded as part of the row address in the present invention.

Further, in memory of a type dividing in the word line direction, word lines of a plurality of arrays activate synchronously together in a one-to-one correspondence. The case of such a memory is essentially the same as that of a single array in the point that the row selection is alternately carried out.

The memory of such an array division type can be applied to both of the first memory array 1 and the second memory array 2. The semiconductor memory device of the present embodiment operates in the same way as that described above irrespective of such an array division and can exhibit the same effects.

Further, there is also a memory wherein a plurality of banks are provided on the same semiconductor chip, and word lines corresponding to different row addresses is activated in parallel, but in the case of such a memory, the first memory array and the second memory array the same as those explained above may be provided as a set for each bank.

Further, close linkage of two memory arrays as explained above is desirably carried out in the same semiconductor chip capable of freely exchanging a large number of signals with a low load. In recent years, however, there have been advances in the technique referred to SIP (system in package). It is now becoming possible to perform low load, high speed, and large volume signal exchange even in a plurality of semiconductor chips in a package. Accordingly, when using such a technique, it is also possible to include two memory arrays by different semiconductor chips in the same package.

Second Embodiment

Next, a second embodiment of the present invention will be explained.

In the semiconductor memory device shown in FIG. 1, only one memory group can be utilized for the repair of defects in each memory region (memory region of 16 word line groups 11) of the first memory array 1. Contrary to this, in the semiconductor memory device according to the present embodiment, N (N indicates a natural number of 2 or more) number of memory groups can be utilized for the repair of defects in one memory region.

The semiconductor memory device according to the present embodiment, in the same way as the semiconductor memory device shown in FIG. 1, has a first memory array 1, a second memory array 2, row decoders 3 and 7, a column selector 5, sense amplifiers 4 and 8, a selector 6, and a controlling unit 15.

However, in the present embodiment, each word line of the second memory array 2 has N number of memory groups (hereinafter referred to as a "memory set") having the configuration shown in FIG. 2. When one word line is selected by the row decoder 7, data of one memory set (N number of memory groups) are read out from the sense amplifier 8.

In the following explanation, these N number of memory groups are discriminated by referring to them as the "first memory group" to the "N-th memory group".

Figure 4:
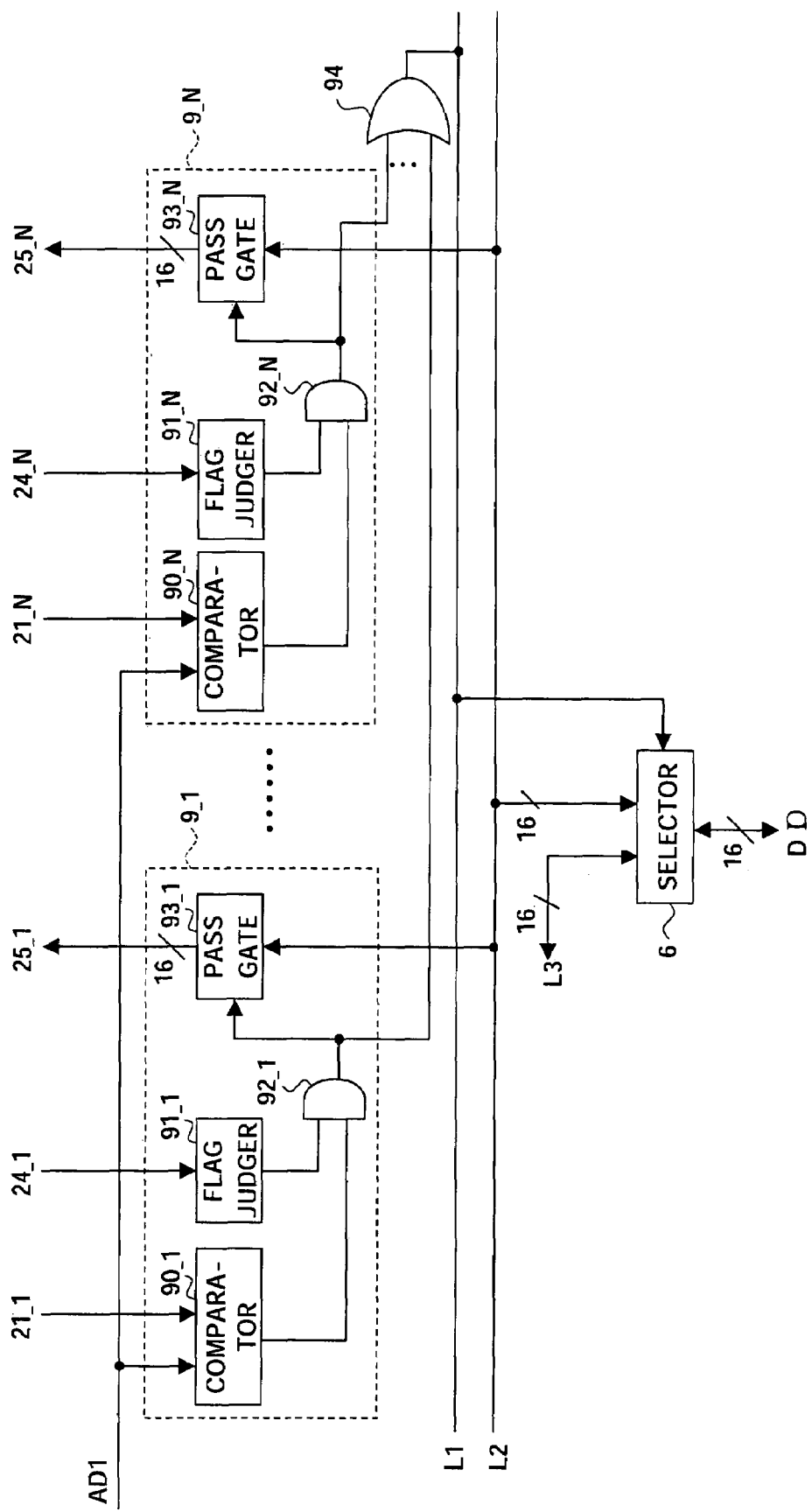
FIG. 4 is a block diagram of an example of the configuration of a comparing/judging unit and a decoder according to a second embodiment of the invention.

Further, as shown in FIG. 4, the semiconductor memory device according to the present embodiment has N number of comparing/judging units 9_1 to 9_N and an OR circuit 94 for computing the logical OR of the judgment signals explained later output from these comparing/judging units.

Each comparing/judging unit 9_i (i indicates an integer of 1 to N) has a comparator 90_i, a flag judger 91_i, an AND circuit 92_i, and a pass gate 93_i.

Each comparator 90_i receives as input 4 bits address in the row address ADR and the column address ADC (hereinafter, this two addresses will be referred to as the "address AD1") and compares the address AD1 and a defective memory address 21_i read out from the i-th memory group. When the two coincide, it outputs the signal of "1", while when the two do not coincide, it outputs the signal of "0".

Each flag judger 91_i receives as input the 3 bits of flag data 24_i read out from the i-th memory group. When two or more bits of "1" are included in these 3 bits, it outputs the signal of "1", while when they are not included, it outputs the signal of "0".

Each AND circuit 92_i computes the logical AND of output signals of the comparator 90_i and the flag judger 91_i and outputs this computation result as the judgment signal indicating whether or not the input address (ADR, ADC) is an address of defective memory. Namely, when this judgment signal is "1", the input address is the address of defective memory, while when the judgment signal is "0", the input address is the address of normal memory.

Accordingly, the output signal of the OR circuit 94, which is the logical OR of all judgment signals of the AND circuits 92_1 to 92_N, becomes "1" when the input address is an address of defective memory, while becomes "0" when it is an address of normal memory. The output signal of the OR circuit 94 is output to a judgment signal line L1.

Each pass gate 93_i is connected to the input/output lines of the sense amplifier 8 having one terminal connected to the redundant memory of the i-th memory group and having the other terminal connected to the selector 6 via a common lines L2. Then, these two terminals become conductive when the judgment signal of the AND circuit 92_i is "1" and shut when the judgment signal is "0".

The selector 6 connects the common lines L2 connected to the pass gates 93_1 to 93_N and the data bus DIO when the output signal of the OR circuit 94 output to the judgment signal line L1 is "1". When the output signal is "0", the selector 6 connects input/output lines L3 of the column selector 5 and the data bus DIO.

Next, an explanation will be given of the operation of the semiconductor memory device according to the present embodiment having the above configuration.

The overall operation of the semiconductor memory device according to the present embodiment is the same as the flow chart shown in FIG. 3. The difference from the semiconductor memory device shown in FIG. 1 resides in the point that the defect judgment operation in step ST15 and the access switch operation in step ST16 are carried out based on the data of N number of memory groups.

Namely, the address AD1 constituted by part of the input address (ADR, ADC) is compared with N number of defective memory addresses output from the N number of memory groups. Then, when the address AD1 coincides with for example the defective memory address 21_i and the flag data 24_i corresponding to this is valid in state, the judgment signal of the AND circuit 92_i becomes "1", the pass gate 93_i becomes conductive, and the output signal of the OR circuit 94 becomes "1".

Here, when assuming that all defective memory addresses stored in N number of memory groups are different addresses, only the output signal of the AND circuit 92_i becomes "1" among the judgment signals of the AND circuits 92_1 to 92_N, and only the pass gate 93_i becomes conductive among the pass gates 93_1 to 93_N.

Accordingly, among the N number of redundant memories on the word lines selected by the row decoder 7, only the redundant memory included in the same memory group as the memory from which the valid defective memory address coinciding with the address AD1 was read out becomes able to be accessed from the data bus DIO.

As explained above, in the semiconductor memory device according to the present embodiment, the second memory array 2 is provided with a plurality of memory sets, each of which corresponding to each of a plurality of memory regions (memory regions of the word line group 11) on the first memory array 1 and has N number of memory groups. When the address (ADR, ADC) for accessing the first memory array 1 is input, the memory set corresponding to the memory region including the memory to be accessed are selected, and the defective memory addresses and the flag data are read out from the selected memory set. Further, at this time, each redundant memory included in the selected memory set becomes accessible. The comparing/judging units 9_1 to 9_N compare the defective memory addresses 21_1 to 21_N read out from the selected memory set and the addresses AD1, and judge whether or not the flag data 24_1 to 24_N read out from the memory groups are valid. When any of the comparing/judging units 9_1 to 9_N judges that the input address is an address of defective memory based on the results of this address comparison and flag judgment, an access operation to the defective memory is switched to an access operation to redundant memory included in the same memory group from which the address of the defective memory was read out.

Accordingly, it becomes possible to repair a plurality of defective memories in one memory region of the first memory array 1.

Third Embodiment

Next, a third embodiment of the present invention will be explained.

In the semiconductor memory devices according to the first and second embodiments, when there is even 1 bit of a memory cell having a defect included in 1 word (16 bits) of memory, all memory cells of the 1 word are replaced by 1 word of the redundant memory. On the other hand, in the semiconductor memory device shown in FIG. 5 explained next, the memory cell having the defect in the 1 word is further designated by the address stored in the memory group, and this defective memory cell is replaced by 1 bit of a redundant memory cell.

Figure 5:
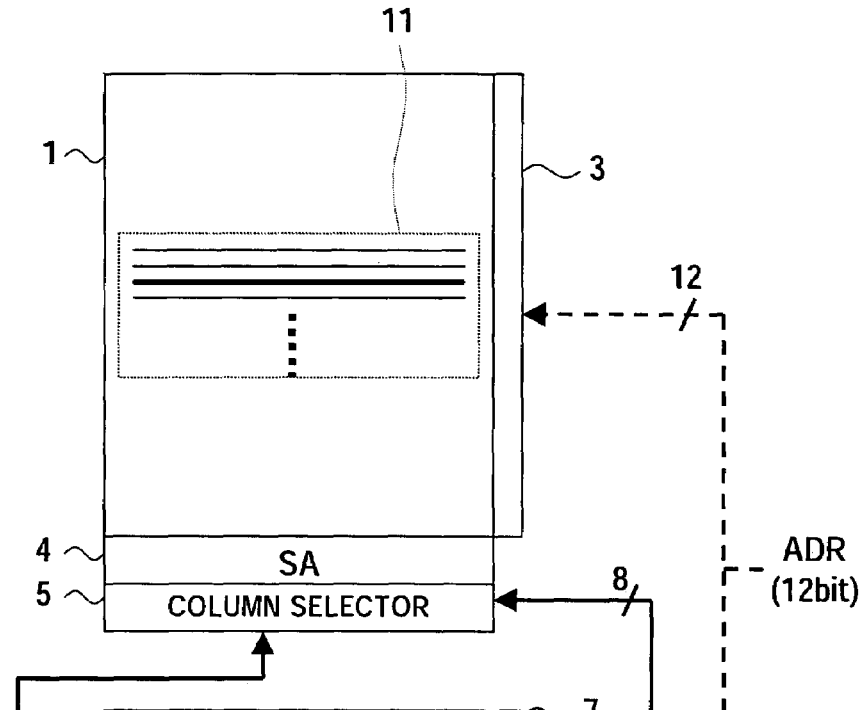
FIG. 5 is a block diagram of an example of the configuration of a semiconductor memory device according to a third embodiment of the invention.

FIG. 5 is a block diagram of an example of the configuration of the semiconductor memory device according to the third embodiment of the present invention. The same notations as those of FIG. 1 indicate the same components.

Namely, the semiconductor memory device illustrated in FIG. 5, in the same way as the semiconductor memory device shown in FIG. 1, has a first memory array 1, row decoders 3 and 7, a sense amplifier 4, a column selector 5, a comparing/judging unit 9, and a controlling unit 15. Further, as components different from those of the semiconductor memory device shown in FIG. 1, it has a second memory array 2A, a sense amplifier 8A, a selector 6A, and a decoder 10.

Figure 6:
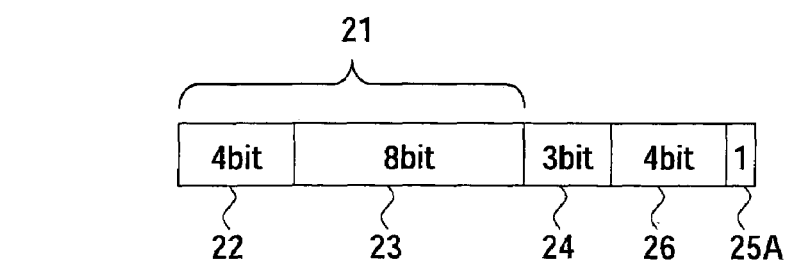
FIG. 6 is a view illustrating an example of the configuration of a memory group according to the third embodiment.

The second memory array 2A has a different configuration of the memory groups in comparison with the first memory array 1. FIG. 6 is a view illustrating an example of the configuration of a memory group of the second memory array 2A. For example, as shown in FIG. 6, a memory group of the second memory array 2A has memory for the defective memory address 21 and the flag data 24 in the same way as already explained FIG. 2 and, differently from it, has 4 bits of memory for storing the defective cell address 26 and 1 bit of redundant memory.

The defective cell address 26 designates a defective memory cell among the 16 memory cells which configure a memory designated by the defective memory address 21. Accordingly, the 1 bit of a defective memory cell designated by the defective cell address 26 in the 1 word designated by the defective memory address 21 is replaced by 1 bit of the redundant memory in a memory group.

The sense amplifier 8A reads and writes the data with respect to the memory groups shown in FIG. 6. In comparison with the sense amplifier 8, the number of bits of the input/output data is different.

The selector 6A connects one input/output line of the sense amplifier 8A connected to 1 bit of redundant memory to the corresponding bit of the data bus DIO in place of any indicated one of the 16 bits of the input/output lines of the column selector 5 in response to a decode signal supplied from the decoder 10, and connects the remaining 15 bits of the input/output lines to the corresponding bits of the data bus DIO. Alternatively, it connects all of the 16 bits of the input/output lines of the column selector 5 to the corresponding bits of the data bus DIO.

When the comparing/judging unit 9 judges that the input address is an address of defective memory, the decoder 10 generates a decode signal for switching any one of the 16 bits of the input/output lines of the column selector 5 to a redundant memory use input/output line based on the 4 bits of defective cell address 26 output from the memory group. When it judges that the input address is an address of normal memory, the decoder 10 generates a decode signal for connecting all of the 16 bits of input/output lines to the data bus DIO.

The overall operation of the semiconductor memory device shown in FIG. 5 having the above configuration is the same as that in the already explained flow chart shown in FIG. 3. The difference from the semiconductor memory device shown in FIG. 1 resides in the point that an access operation to the 1 bit of the defective memory cell designated by the defective cell address 26 in the 1 word of the defective memory designated by the defective memory address 21 is switched to an access operation to 1 bit of the redundant memory in the access switch operation of step ST16.

In the case of defects occurring for memory cells at random, even in the way of replacing 1 bit, a defect can be repaired with a probability not different from the way of replacing 16 bits. In addition, the bit length of the memory group can be shortened, therefore the circuit scale of the second memory array and the sense amplifier can be reduced.

Fourth Embodiment

Next, a fourth embodiment of the present invention will be explained.

In the semiconductor memory device shown in FIG. 5, only one memory group can be utilized for repair of defects in each memory region of the first memory array 1. Contrary to this, in the semiconductor memory device according to the present embodiment, N number of memory groups can be utilized for the repair of defects with respect to one memory region.

The semiconductor memory device according to the present embodiment, in the same way as the semiconductor memory device shown in FIG. 5, has a first memory array 1, a second memory array 2A, row decoders 3 and 7, a column selector 5, sense amplifiers 4 and 8A, a selector 6A, and a controlling unit 15.

However, in the present embodiment, each word line of the second memory array 2A has N number of memory groups having the configuration shown in FIG. 6. When one word line is selected by the row decoder 7, the data of N number of memory groups (the first memory group to the N-th memory group) is read out from the sense amplifier 8A.

Figure 7:
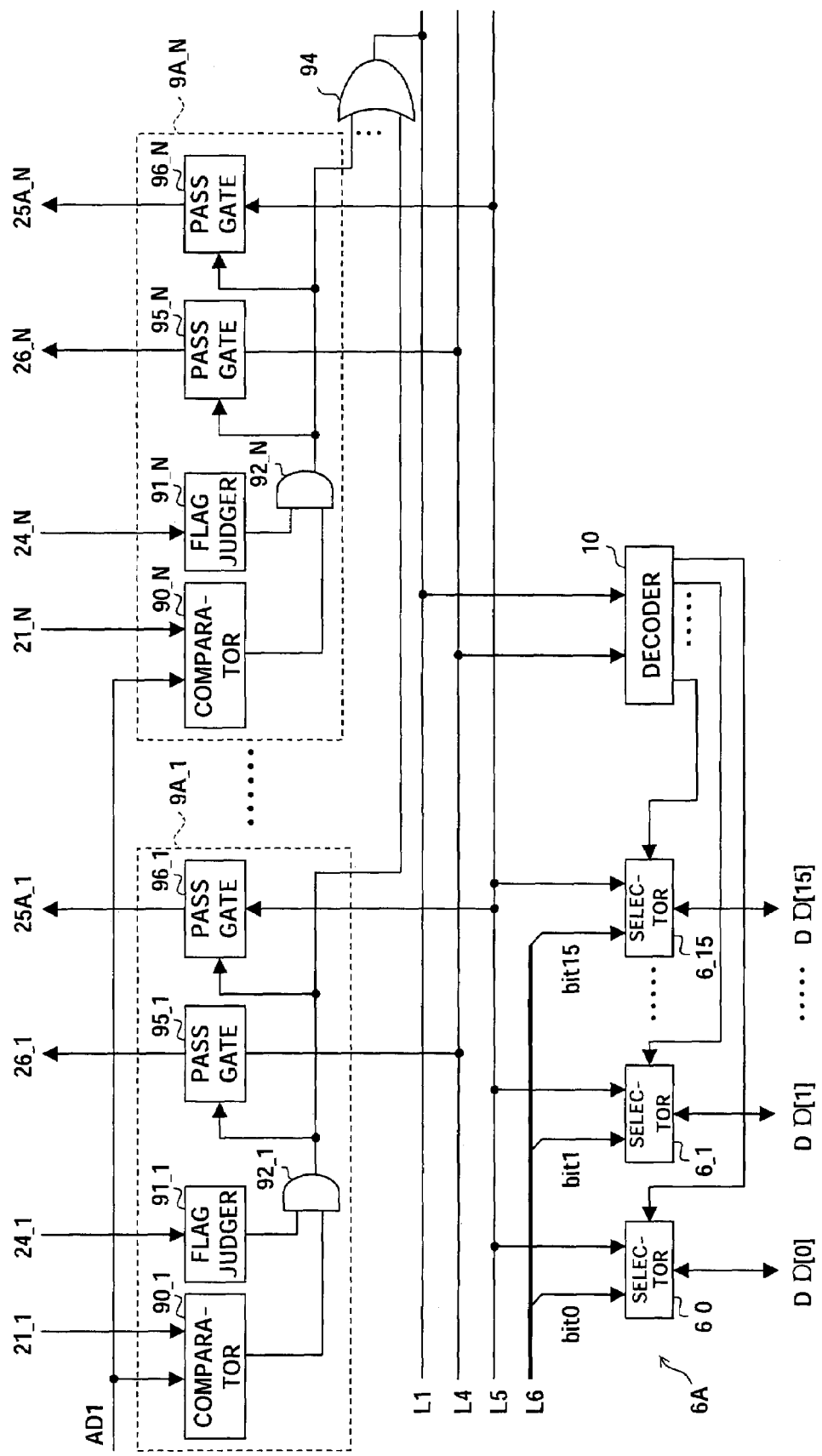
FIG. 7 is a block diagram of an example of the configuration of a comparing/judging unit and a decoder according to a fourth embodiment of the invention.

Further, as shown in FIG. 7, the semiconductor memory device according to the present embodiment has N number of comparing/judging units 9A_1 to 9A_N and an OR circuit 94 for computing the logical OR of the judgment signals output from these comparing/judging units.

Each comparing/judging unit 9A_i, in the same way as the comparing/judging unit 9_i shown in FIG. 4, has a comparator 90_i, a flag judger 91_i, and an AND circuit 92_i. Further, as components different from those of the comparing/judging units 9_i, it has pass gates 95_i and 96_i.

Each pass gate 95_i has one terminal connected to the input/output lines for transmitting the defective cell address 26_i of the i-th memory group therethrough and has the other terminal connected to the input terminal of the defective cell address of the decoder 10 via a common lines L4. Then, these two terminals become conductive when the judgment signal of the AND circuit 92_i is "1" and shut when the judgment signal is "0".

Each pass gate 96_i has one terminal connected to the input/output lines of the sense amplifier 8 connected to the 1 bit of redundant memory of the i-th memory group and has the other terminal connected to the selector 6A via a common lines L5. Then, these two terminals become conductive when the judgment signal of the AND circuit 92_i is "1" and shut when the judgment signal is "0".

The selector 6A has selectors 6_0 to 6_15 corresponding to 16 bits as shown in for example FIG. 7. A selector 6_k (k indicates an integer of 0 to 15) selects the common line L5 connected to the pass gates 96_1 to 96_N or the k-th bit signal line of the input/output lines L6 of the column selector 5 in response to the decode signal supplied for the selector 6_k by the decoder 10, and connects the selected line to the k-th bit signal line of the data bus DIO.

Next, an explanation will be given of the operation of the semiconductor memory device according to the present embodiment having the above configuration.

The overall operation of the semiconductor memory device according to the present embodiment is the same as that of the semiconductor memory device shown in FIG. 5. The difference from this resides in the point that the defect judgment operation and the access switch operation are carried out based on the data of N number of memory groups.

Namely, the address AD1 constituted by part of the input address (ADR, ADC) is compared with N number of defective memory addresses output from N number of memory groups. When the address AD1 coincides with for example 21_i and, at the same time, the flag data 24_i corresponding to this is valid in state, the judgment signal of the AND circuit 92_i becomes "1", the pass gates 95_i and 96_i become conductive, and the output signal of the OR circuit 94 becomes "1".

Here, if all of the defective memory addresses stored in the N number of memory groups are different, among the pass gates 95_1 to 95_N, only the pass gate 95_i becomes conductive, and among the pass gates 96_1 to 96_N, only the pass gate 96_i becomes conductive.

In this case, the defective cell address 26_i of the i-th memory group is input to the decoder 10, and the data input/output line of the redundant memory of the i-th memory group is connected to the common line L5 connected to the selectors 6_0 to 6_15. Then, when a decode signal in accordance with the defective cell address 26_i is generated in the decoder 10 and the selection states of the selectors 6_0 to 6_15 are set, the signal line of any bit of the data bus DIO is connected to the data input/output line of the redundant memory of the i-th memory group, and the signal lines of the other bits are connected to the input/output lines of corresponding bits of the column selector 5.

As explained above, according to the semiconductor memory device of the present embodiment, when an input address is judged to be an address of a defective memory, an access operation to a memory cell designated by a defective cell address in a defective memory is switched to an access operation to a redundant memory. In this access switching operation, the redundant memory being accessed instead of the defective memory cell is included in the same memory group which includes the memory outputting valid defective memory address coinciding with the address AD1.

Accordingly, it becomes possible to repair a plurality of defective memories in one memory region of the first memory array 1, and further possible to repair each 1 bit defect. Therefore, the bit length of the memory groups becomes shorter, and the circuit scale of the second memory array and the sense amplifier thereof can be reduced.

Fifth Embodiment

Next, a fifth embodiment of the present invention will be explained.

In the semiconductor memory devices shown in FIG. 1 and FIG. 5, redundant memory was provided in the second memory array different from the usually used first memory array. For this reason, it is difficult to access the redundant memory at the same timing as that for the memory in the first memory array.

For example, when setting redundant memory to the accessible state according to the defective memory addresses read out from the memory groups, then writing in the redundant memory, the load and resistance of the signal path driven when writing are completely different between the redundant memory on the second memory array and the memory on the first memory array, therefore there is possibility that the write speeds of the two will different. If the write speed to the second memory array is slower than the write speed to the first memory array, the write speed to redundant cells will restrict the access speed of the entire memory.

Such a problem also restricts the configuration of the second memory array. For example, when the first memory array is a DRAM, it becomes impossible to utilize a ferroelectric memory, flash memory, etc. as the second memory array because their write speed is slower than that of the second memory array.

In the semiconductor memory device shown in FIG. 8 explained next, by providing redundant cells on the same memory array, the difference of the access speed described above between the usually used memory and the redundant memory is eliminated.

Figure 8:
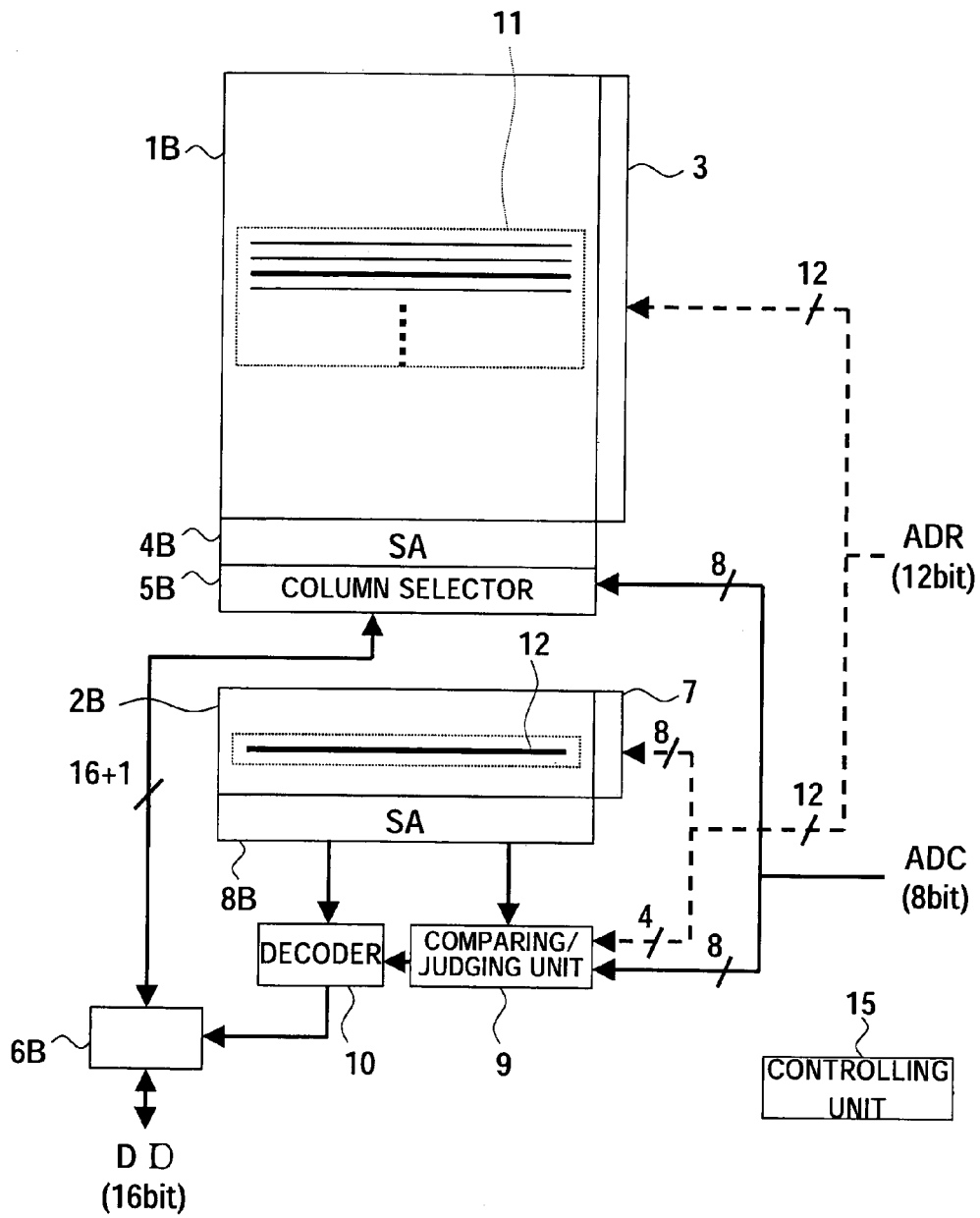
FIG. 8 is a block diagram of an example of the configuration of a semiconductor memory device according to a fifth embodiment of the invention.

FIG. 8 is a block diagram of an example of the configuration of a semiconductor memory device according to the fifth embodiment of the present invention.

The semiconductor memory device illustrated in FIG. 8 has a first memory array 1B, a second memory array 2B, row decoders 3 and 7, a column selector 5B, sense amplifiers 4B and 8B, a selector 6B, the comparing/judging unit 9, a decoder 10, and a controlling unit 15.

The same notations as those of FIG. 1, FIG. 5, and FIG. 8 indicate the same components. Namely, the row decoders 3 and 7, the comparing/judging unit 9, the decoder 10, and the controlling unit 15 are the same as those already explained by referring to FIG. 1 and FIG. 5. Accordingly, their explanations will be omitted below. Only the other components will be explained.

The first memory array 1B is the main memory portion in the present semiconductor memory device and has 16 bits of memory and 1 bit of redundant memory at $(2^{12}) \times (2^8)$ addresses each indicated by 12 bits of row address ADR and 8 bits of column address ADC. That is, it has 1 bit of redundant memory for each 1 word of memory indicated by an input address.

Accordingly, the first memory array 1B in the present example has a storage capacity of $(2^{12}) \times (2^8) \times 17 = 17$ Mbits. The storage capacity is larger than the first memory array 1 by exactly the 1 Mbit of the redundant memory.

The sense amplifier 4B reads and writes data with respect to the memory cells via bit lines of the first memory array 1B.

The sense amplifier 8B reads and writes data with respect to the memory cells via bit lines of the second memory array 2B.

The sense amplifiers 4B and 8B have different numbers of bits of input and output data in comparison with the above sense amplifiers 4 and 8.

The column selector 5B selects 17 bits of memory (set of the usually used 1 word of memory+1 bit of redundant memory) in accordance with the 8 bits of input column address ADC from one row's worth of memory of the first memory array 1B accessed via the sense amplifier 4B.

The second memory array 2B has a plurality of memory groups. Each memory group includes a memory for storing a defective memory address in each of a plurality of memory regions obtained by dividing the first memory array 1B for each 16 word lines, a memory for storing flag data indicating whether or not the defective memory address is valid, and a memory for storing a defective cell address designating a defective memory cell among a plurality of memory cells which configure a memory designated by the defective memory address.

The second memory array 2B has for example $2^8$ number of word lines designated by 8 bits of address in the 12 bits of a row address ADR. Each word line has an above memory group.

Accordingly, one word line 12 in the second memory array 2B and 16 word line groups 11 in the first memory array 1B are in a one-to-one correspondence. When any word line of a word line group in the first memory array 1B is selected at the row decoder 3, the common word line corresponding to this word line group is selected at the row decoder 7, whereby the memory group connected to the selected word line thereof becomes accessible.

Namely, the second memory array 2B has a plurality of memory groups, each of which corresponds to each memory region obtained by dividing the first memory array 1B for each 16 word lines.

Figure 9:
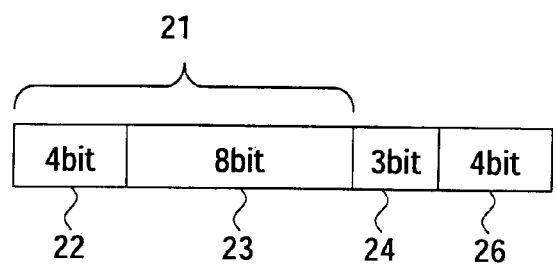
FIG. 9 is a view illustrating an example of the configuration of a memory group according to the fifth embodiment.

FIG. 9 is a view illustrating an example of the configuration of a memory group of the second memory array 2B.

For example, as shown in FIG. 9, a memory group of the second memory array 2B has 12 bits of memory for storing a defective memory address 21, 3 bits of memory for storing flag data 24, and 4 bits of memory for storing a defective cell address 26. This configuration is equal to that of the memory group shown in FIG. 6 minus the 1 bit of redundant memory.

The defective memory address 21, the flag data 24, and the defective cell address 26 must always be held irrespective of the on/off state of the power supply. For this reason, preferably the second memory array 2B is a nonvolatile memory such as a ferroelectric memory. When configuring the second memory array 2B by a volatile memory, for example the data can be loaded from nonvolatile memories separately provided inside or outside the memory chip as well.

The selector 6B connects 1 bit of the input/output line of the column selector 5 connected to 1 bit of the redundant memory to the corresponding bit of the data bus DIO in place of any indicated bit of the 16 bits of the input/output lines of the column selector 5 connected to the usually used 16 bits of memory in response to the decode signal supplied from the decoder 10, and connects the remaining 15 bits of the input/output lines to the corresponding bits of the data bus DIO. Alternatively, it connects all of the 16 bits of the input/output lines of the column selector 5 connected to the usually used 16 bits of memory to the corresponding bits of the data buses DIO.

Figure 10:
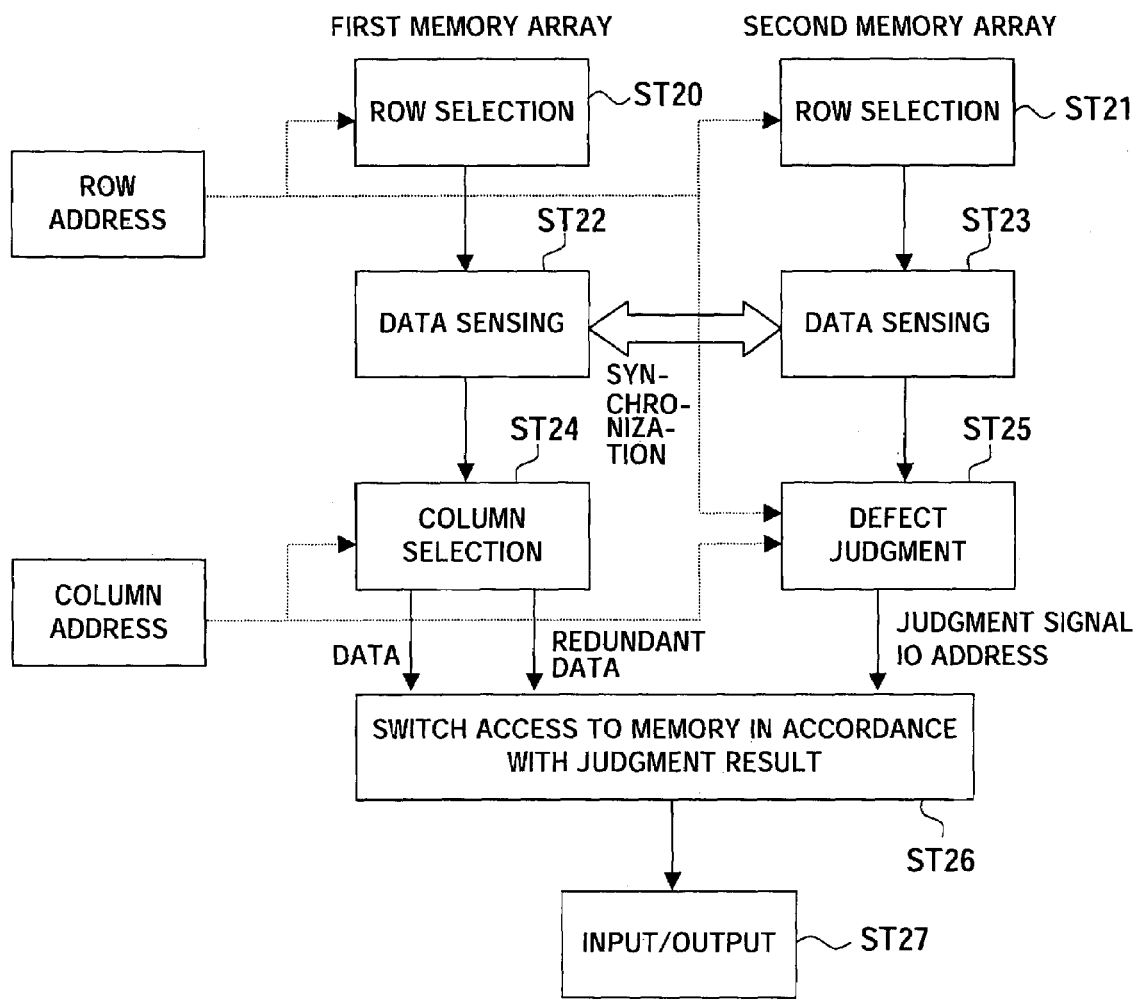
FIG. 10 is a flow chart for explaining an example of the operation of the semiconductor memory device shown in FIG. 8.

Here, an explanation will be given of the operation of the semiconductor memory device shown in FIG. 8 having the above configuration by referring to the flow chart shown in FIG. 10.

Steps ST20 and ST21

A predetermined control signal indicating the writing or reading of the data is input, whereby the selection operations of word lines at the row decoders 3 and 7 are executed in parallel under the control of the controlling unit 15.

Steps ST22 and ST23

The data of the memory cells connected to the word lines selected by the row decoders 3 and 7 are read out to the bit lines, amplified by the sense amplifiers 4B and 8B, and latched in values. By this, the data of memory cells on the word lines corresponding to the row address ADR are acquired from the first memory array 1B, and the data of the memory group corresponding to the row address ADR are acquired from the second memory array 2B.

In usual access to the semiconductor memory, the longest time is required for this data sensing process, but according to the semiconductor memory device shown in FIG. 8, the operations of the data sensing process in the first memory array 1B and the second memory array 2B can be synchronized and performed in parallel without performing special conversion for the input addresses. For this reason, the delay of the access time accompanying the repair of defects can be suppressed to the lowest limit.

Steps ST24 and ST25

The data acquired from the first memory array 1B is input to the column selector 5B, and 17 bits data (1 word+1 redundant bit) in accordance with the column address ADC is selected from among the acquired data.

On the other hand, among the data acquired from the second memory array 2B, the defective memory addresses 21 and the flag data 24 are input to the comparing/judging unit 9. Then, the addresses 23 of the defective memory are compared with the column address ADC, and the addresses 22 are compared with part (4 bits) of the row address ADR. Further, it is judged whether or not the flag data 24 is valid in state in accordance with the number of bits of "1" included in the 3 bits of flag data 24.

Step ST26

When a coincidence between the defective memory addresses 21 acquired from the second memory array 2B and the input address is found and the flag data 24 is valid in state, it is judged that the input address is an addresses of defective memory. In this case, based on the defective cell addresses 26 output from the memory group, one of the 16 bits of the input/output lines of the column selector 5B connected to the usually used memories is switched to 1 bit of the input/output line of the column selector 5B connected to the redundant memory.

On the other hand, when it is judged that the input address is the address of normal memory, all of the 16 bits of the input/output lines connected to the usually used memory are connected to the data bus DIO.

Step ST27

When the connection of the selector 6B is finalized, the reading and writing operation with respect to the usually used memory or the redundant memory of the first memory array 1B are carried out.

As explained above, according to the semiconductor memory device shown in FIG. 8, redundant memory is included in the first memory array 1B. When one memory in the first memory array 1B is selected for accessing in accordance with the input address (ADR, ADC), the redundant memory connected to the same word line of the selected memory becomes accessible. Then, when it is judged that the input address is an address of a defective memory in the comparing/judging unit 9, an access operation to the defective memory cell designated by the defective cell address 26 in the defective memory is switched to an access operation to 1 bit of redundant memory connected to the same word line of the defective memory cell.

In this way, by providing usually used memory and redundant memory on the same memory array, the difference of the access speed between these two memories becomes very small, so the problem of a drop of the access speed when the destination of access is switched to redundant memory can be solved. Further, since such a problem is solved, the restriction of the type of the memory used in the first memory array 1B and the second memory array 2B can be eliminated.

Other than this, the feature that a wide range of defective memory addresses is stored in the memory groups, the feature that access to the memory groups is carried out without adding any special conversion processing to the input address, the feature that the read operation with respect to two memory arrays 1B and 2B are executed in parallel, and the feature that access to 1 bit of a defective memory cell in 1 word of memory is switched to access to redundant memory cell are the same as the already explained semiconductor memory devices shown in FIG. 1 and FIG. 5, so it is possible to exhibit the same effects to those.

Further, the feature that memories of the array division type and the bank type can be applied to the first memory array 1B and the second memory array 2B is the same as the already explained semiconductor memory devices.

Sixth Embodiment

Next, a sixth embodiment of the present invention will be explained.

In the semiconductor memory device shown in FIG. 8, only one memory group can be utilized for the repair of defects in each memory region of the first memory array 1B. Contrary to this, in the semiconductor memory device according to the present embodiment, N number of memory groups can be utilized for the repair of defects with respect to one memory region.

The semiconductor memory device according to the present embodiment, in the same way as the semiconductor memory device shown in FIG. 8, has a first memory array 1B, a second memory array 2B, row decoders 3 and 7, a column selector 5B, sense amplifiers 4B and 8B, a selector 6B, a decoder 10, and a controlling unit 15.

Figure 11:
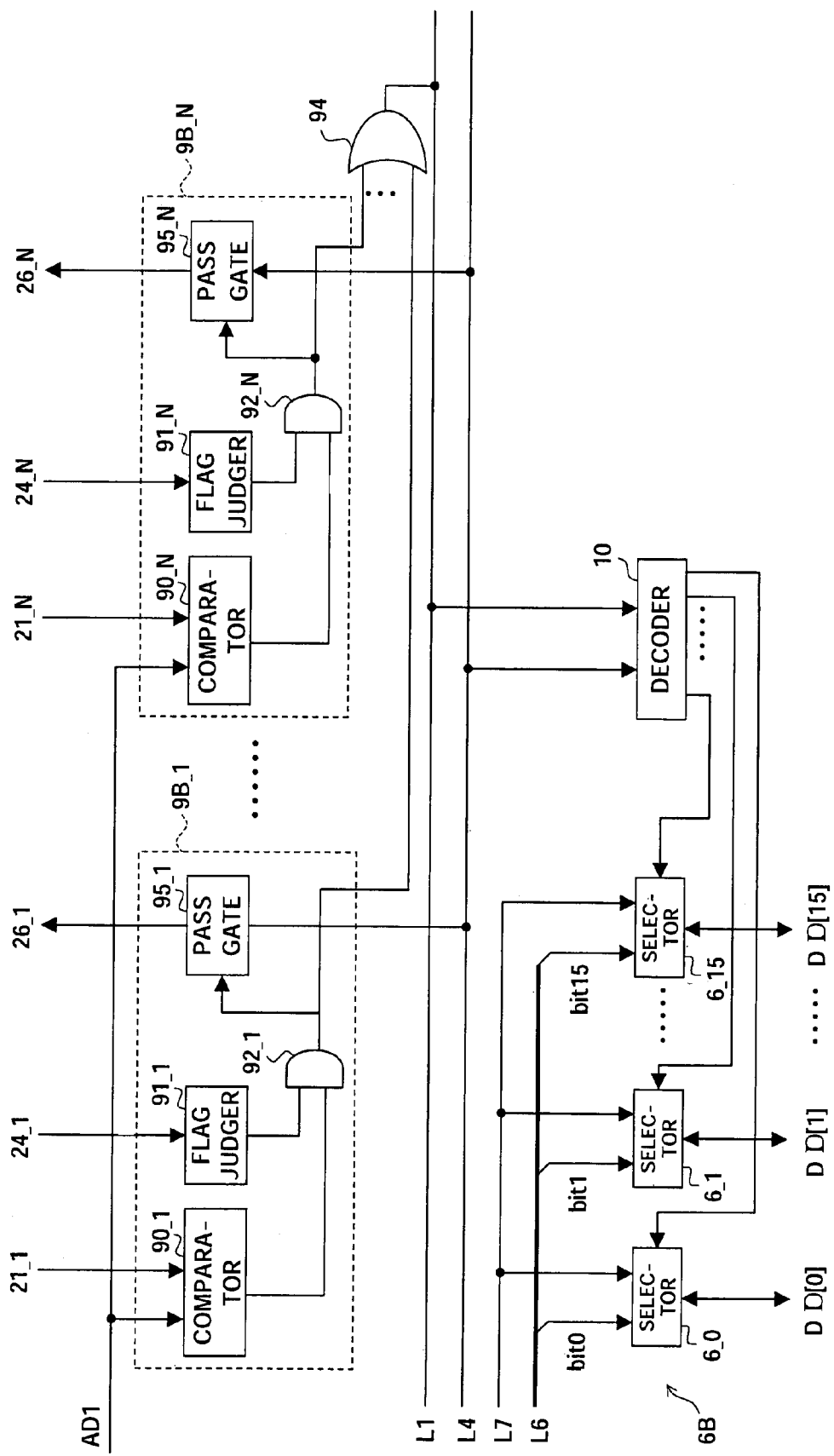
FIG. 11 is a block diagram of an example of the configuration of a comparing/judging unit and a decoder according to a sixth embodiment of the invention.

Further, as shown in FIG. 11, the semiconductor memory device according to the present embodiment has N number of comparing/judging units 9B_1 to 9B_N and an OR circuit 94 for computing the logical OR of the judgment signals output from these comparing/judging units.

Each comparing/judging unit 9B_i, in the same way as the comparing/judging unit 9A_i shown in FIG. 7, has a comparator 90_i, a flag judger 91_i, an AND circuit 92_i, and a pass gate 95_i. The difference from the comparing/judging unit 9A_i resides in the point that the pass gate 96_i is not included.

Each pass gate 95_i has one terminal connected to the input/output lines for transmitting the defective cell address 26_i of the i-th memory group therethrough and has the other terminal connected to the defective cell address input terminal of the decoder 10 via the common lines L4. These two terminals become conductive when the judgment signal of the AND circuit 92_i is "1" while shut when the judgment signal is "0".

The selector 6B, in the same way as the selector 6A shown in FIG. 7, has selectors 6_0 to 6_15 corresponding to the 16 bits. The difference from the selector 6A resides in the connection of the redundant memory side. Namely, as shown in FIG. 11, in the selector 6B, an input/output line L7 for the redundant memory of the column selector 5B is connected to terminals of the selectors 6_0 to 6_15 on the redundant memory side.

The operation of the semiconductor memory device according to the present embodiment having the above configuration is almost the same as that of the semiconductor memory device explained in the fourth embodiment except that the redundant memory to be accessed is in the second memory array 2B.

Namely, when it is judged that the input address is the address of a defective memory, an access operation to the a memory cell designated by a defective cell address in a defective memory is switched to an access operation to a redundant memory included in the first memory array 1B. In this access switching operation, the redundant memory being accessed instead of the defective memory cell forms a pair with the memory designated by the input address.

Accordingly, it becomes possible to repair a plurality of defective memories in one memory region of the first memory array 1B, the probability of repair can be raised even in memory having many small defects, and the yield can be improved.

Seventh Embodiment

Next, a seventh embodiment of the present invention will be explained.

In the semiconductor memory devices of FIG. 1, FIG. 5, and FIG. 8 explained above, when the word line is selected in the first memory array and the column is selected, the usually used memory and the redundant memory are switched by the selector. Further, in this way, the access switching operation is carried out after the usual data selection stage. However, the present invention is not restricted to such a configuration. Many variations can exist.

In the semiconductor memory device shown in FIG. 12 explained next, the column selection operation is carried out in two stages before and after the selector for access switching between usually used memory and redundant memory.

Figure 12:
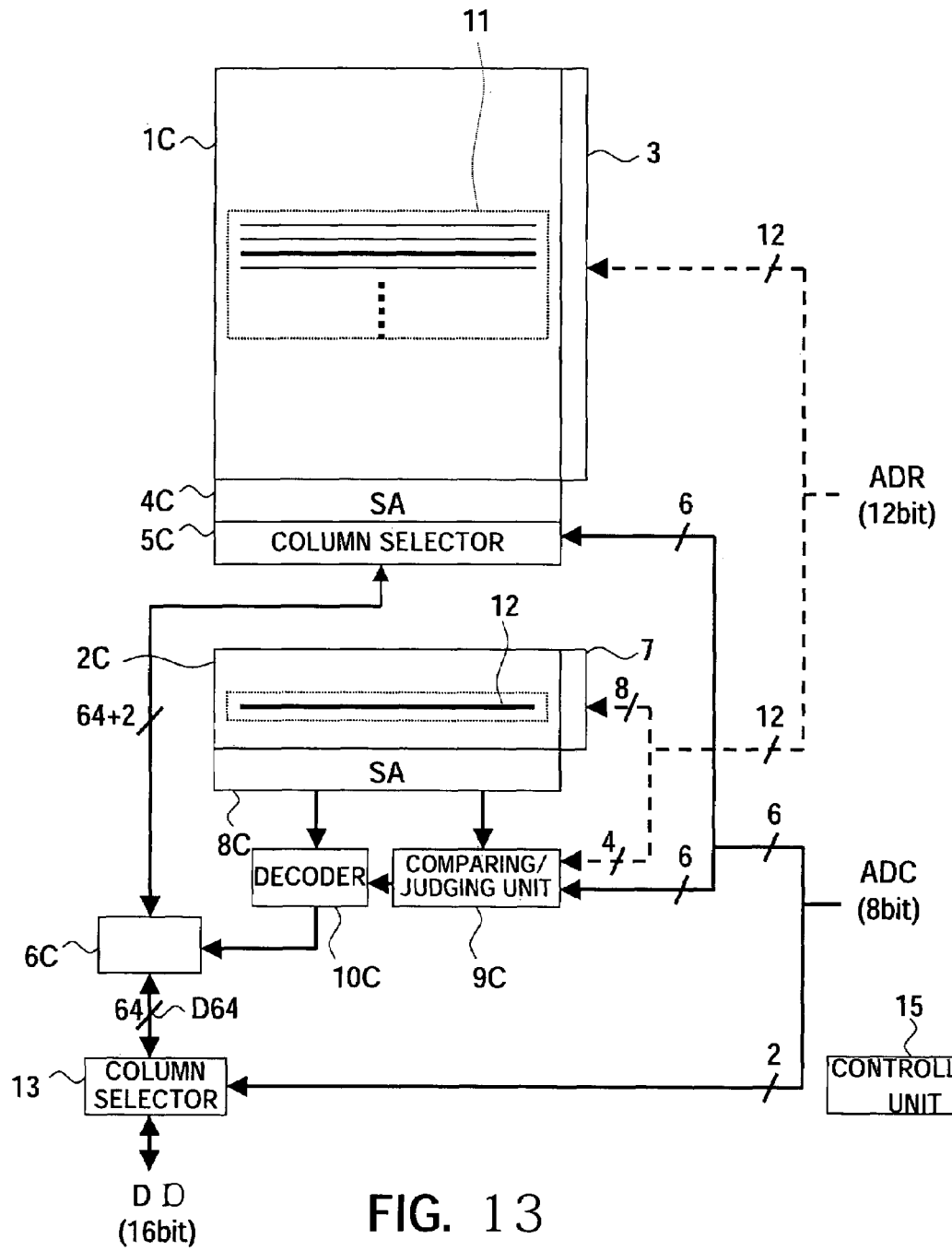
FIG. 12 is a block diagram of an example of the configuration of a semiconductor memory device according to a seventh embodiment of the invention.

FIG. 12 is a block diagram of an example of the configuration of a semiconductor memory device according to the seventh embodiment of the present invention.

The semiconductor memory device illustrated in FIG. 12 has a first memory array 1C, a second memory array 2C, row decoders 3 and 7, column selectors 5C and 13, sense amplifiers 4C and 8C, a selector 6C, a comparing/judging unit 9C, a decoder 10C, and a controlling unit 15.

Here, the same notations as those of FIG. 1 and FIG. 12 indicate the same components. Namely, the row decoders 3 and 7 and the controlling unit 15 are the same as those already explained by referring to FIG. 1. Accordingly, in the following explanation, their explanation will be omitted, and an explanation will be given of the other components.

The first memory array 1C is the main memory portion in the present semiconductor memory device and has 1 word (16 bits) of memory at $2^{12} \times 2^8$ addresses each indicated by 12 bits of row address ADR and 8 bits of column address ADC. Further, when defining 4 continuous words of memory region as a sub-memory region, 2 bits of redundant memory are provided for each sub-memory region. Namely, the memory region corresponding to 16 word lines are further divided into sub-memory regions for each 4 words. Two bits of redundant memory are provided for each sub-memory region.

Accordingly, in the first memory array 1C, the storage capacity of usually used memory is 16 Mbits or the same as that of the first memory array 1, and the storage capacity of redundant memory is $2^{12} \times 2^6 \times 2 = 512$ Kbits.

The sense amplifier 4C reads and writes the data with respect to the memory cells via bit lines of the first memory array 1C. The sense amplifier 8C reads and writes the data with respect to the memory cells via bit lines of the second memory array 2C. The sense amplifiers 4C and 8C have different numbers of bits of input/output data in comparison with the above sense amplifiers 4 and 8.

The column selector 5C selects 66 bits of memory (4 words of usually used memory+2 bits of redundant memory) from among 1 row's worth of memory of the first memory array 1C accessed via the sense amplifier 4C in accordance with the part (6 bits) of the column address ADC.

The second memory array 2C has a plurality of memory groups. Each memory group includes memories for storing a sub-memory region address, a flag data, a defective cell address and a redundant memory designation data. The sub-memory region address designates a sub-memory region (4 word) including a defective memory in a memory regions (16 word lines). The flag data indicates whether or not the sub-memory region address is valid. The defective cell address designates a defective memory cell among a plurality of memory cells which configure the sub-memory region designated by the sub-memory region address. The redundant memory designation data designates a redundant memory to replace a defective memory cell designated by the defective cell address.

The second memory array 2C has for example $2^8$ word lines indicated by 8 bits of addresses among 12 bits of row addresses ADR, and has the above memory group on each of the word lines.

Accordingly, one word line 12 in the second memory array 2C and 16 word line groups 11 in the first memory array 1C are in a one-to-one correspondence. When any word line of a word line group in the first memory array 1C is selected at the row decoder 3, the common word line corresponding to this word line group is selected at the row decoder 7, whereby the memory group connected to the selected word line thereof becomes accessible.

Namely, the second memory array 2C has a plurality of memory groups, each of which corresponds to each of a plurality of memory regions obtained by dividing the first memory array 1C for each 16 word lines.

Figure 13:
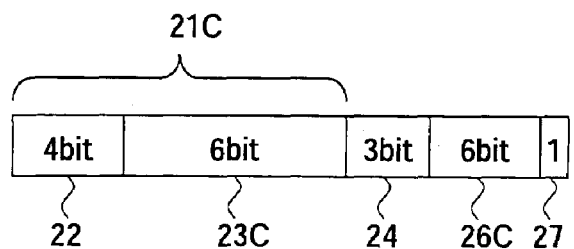
FIG. 13 is a view illustrating an example of the configuration of a memory group according to the seventh embodiment.

FIG. 13 is a view illustrating an example of the configuration of a memory group of the second memory array 2C.

For example, as shown in FIG. 13, a memory group of the second memory array 2C has 10 bits of memory for storing an address 21C of the sub-memory region including a defective memory (hereinafter, described as the defective sub-memory region), 3 bits of memory for storing the flag data 24, 6 bits of memory for storing the defective cell address 26C in the sub-memory region, and 1 bit of memory for storing the redundant memory designation data 27.

The address 21C of a sub-memory region is an address for specifying the defective sub-memory region in the memory region corresponding to the above word line group 11 and includes two addresses 22 and 23. The address 22 is the 4 bits of address excluding the 8 bits of address input to the row decoder 7 in the row address ADR as already explained. By this, one of the 16 word lines in the word line group 11 is specified. The address 23C is 6 bits of address in the 8 bits of the column address and specifies a 4-word sub-memory region in the memory region.

The defective cell address 26C is an address for specifying 1 bit of a defective memory cell in a 4-word (64-bit) defective sub-memory region.

The redundant memory designation data 27 is data for indicating which of 2 bits of redundant memory provided for each sub-memory region is to be used for replacing a defective memory cell.

The comparing/judging unit 9C compares the 4 bits of address excluding the 8 bits of address input to the row decoder 7 in the row address ADR and the addresses 22 included in a data of memory group when the second memory array outputs the data of memory group via the sense amplifier 8C all together in accordance with the row address ADR. Further, it compares 6 bits of address in the 8 bits of column address ADC and the address 23C of the sub-memory region. Further, it also judges whether or not 2 bits or more in 3 bits of the flag data 24 become "1", that is, whether or not the flag data 24 is valid in state.

Then, when the two addresses coincide and the flag data 24 is valid in state, the comparing/judging unit 9C judges that the input address (ADR, ADC) is the address of a defective sub-memory region. Conversely, where the two addresses do not coincide or the flag data 24 is not valid in state, the comparing/judging unit 9C judges that the input address (ADR, ADC) is not the address of a defective sub-memory region.

When the comparing/judging unit 9C judges that the input address is the address of a defective sub-memory region, the decoder 10C generates a decode signal so as to switch any one bit of the input/output lines (64 bits) for the usually used memory of the column selector 5C to the input/output line for the redundant memory designated by the redundant cell designation data 27 based on the 6 bits of defective cell address 26C output from the memory groups. When it judges that the input address is the address of normal memory, it generates the decode signal so that all of the input/output lines for the usually used memory are connected to signal lines D64.

The selector 6C connects the input/output line of the column selector 5C connected to the redundant memory designated by the redundant memory designation data 27 to the one of 64 bits of signal lines D64 in place of indicated 1 bit of input/output line among the 64 bits of input/output lines of the column selector 5 connected to the 64 bits of usually used sub-memory regions in accordance with the decode signal supplied from the decoder 10C, and connects the remaining 63 bits of the input/output lines to the corresponding bits of the signal lines D64. Alternatively, it connects all of the 64 bits of the input/output lines of the column selector 5 to the corresponding bits of the signal lines D64.

The column selector 13 selects 16 bits of the signal lines from the 64 bits of signal lines D64 connected to the selector 6C in accordance with the remaining 2 bits of address excluding the 6 bits of the column address ADC input to the comparing/judging unit 9C, and connects the selected signal lines to the data bus DIO.

Next, an explanation will be given of the operation of the semiconductor memory device shown in FIG. 12 having the above configuration.

When a predetermined control signal instructing the writing or reading operation of the data is input, the selection operations of the word lines in the row decoders 3 and 7 are carried out in parallel under the control of the controlling unit 15. By this, one row's worth of the memory of the first memory array 1C becomes accessible via the sense amplifier 4C, and the memory group (FIG. 13) of the second memory array 2C corresponding to the accessible memory also becomes accessible via the sense amplifier 8C.

The column selector 5C selects 66 bits of memory (4 words of sub-memory region+2 bits of redundant memory) from among 1 row's worth of memory of the first memory array 1C which became accessible in accordance with 6 bits of address in the column address ADC.

While, among the memory group which became accessible in the second memory array 2C, the addresses 21C of the sub-memory regions and the flag data 24 are input to the comparing/judging unit 9C. Then, the address 23C included in the address 21C is compared with part (6 bits) of the column address ADC, and the address 22 is compared with part (4 bits) of the row address ADR. Further, it is judged whether or not the flag data 24 is valid in state in accordance with the number of the bits of "1", included in these 3 bits of flag data 24.

When a coincidence between defective memory address 21C acquired from the second memory array 2C and the input address coincide is found and the flag data 24 is valid in state, it is judged that the input address is the addresses of a defective sub-memory region. In this case, an access operation to memory designated by the defective cell address 26C in the defective sub-memory region is switched to an access operation to redundant memory designated by the redundant memory designation data 27. Namely, the selector 6C switches the input/output line of the column selector 5C connected to the defective cell in the usually used memory to the input/output line of the column selector 5C connected to redundant memory, and connects the switched line to the corresponding bit of the signal line D64. On the other hand, when it is judged that the input address is not the address of a defective sub-memory region, all of the input/output lines of the column selector 5 connected to usually used memory are connected to the signal lines D64.

Then, the column selector 13 selects 16 bits of signal lines from among the 64 bits of signal lines D64 connected to the selector 6C based on the remaining part (2 bits) of the column address ADC and connects the selected lines to the data bus DIO.

When the connections of the selector 6C and the column selector 13 are finalized, the reading and writing operation with respect to the usually used memory or the redundant memory of the first memory array. 1C are carried out.

As explained above, in the semiconductor memory device shown in FIG. 12, each of the memory regions obtained by dividing the first memory array 1C for each 16 word lines is further divided into sub-memory regions for each 4 words. 2 bits of redundant memory are provided for each sub-memory region. When an address for accessing the first memory array 1C is input, the memory of one sub-memory region becomes accessible in accordance with the input address and, at the same time, the redundant memory corresponding to this sub-memory region becomes accessible. Further, the comparing/judging unit 9C judges whether or not the input address is the address of a defective sub-memory region based on the data of the memory group read out from the second memory array 2C. When it is judged to be the address of a defective sub-memory region, the connection of the selector 6C is set so that an access operation to the defective memory in the sub-memory region is switched to an access operation to the redundant memory corresponding to the sub-memory region.

In this way, defects of memory included in a 4-word sub-memory region can be repaired together, therefore, even when a series of memory included in a sub-memory region is sequentially accessed, it becomes unnecessary to repair the defects for every access, so the access speed can be raised.

In the high-speed access mode of the semiconductor memory, there is a mode designating for example the column address, then continuously reading data from 2 to 4 words of memory continuing from this column address (burst mode). As in the present example, if a wide range of defects can be repaired together in advance, such a high-speed mode can be handled without delay.

Eighth Embodiment

Next, an eighth embodiment of the present invention will be explained.

In the semiconductor memory device shown in FIG. 12, only one memory group can be utilized for the repair of defects in a memory region of the first memory array 1C.

Contrary to this, in the semiconductor memory device according to the present embodiment, N number of memory groups can be utilized for the repair of defects for one memory region.

In the same way as the semiconductor memory device shown in FIG. 12, the semiconductor memory device according to the present embodiment has a first memory array 1C, a second memory array 2C, row decoders 3 and 7, column selectors 5C and 13, sense amplifiers 4C and 8C, a selector 6C, and a controlling unit 15.

In the present embodiment, each word line of the second memory array 2C has N number of memory groups having the configuration shown in FIG. 13. When the row decoder 7 selects one word line, the data of N number of memory groups (the first memory group to the N-th memory group) is read out from the sense amplifier 8C.

Figure 14:
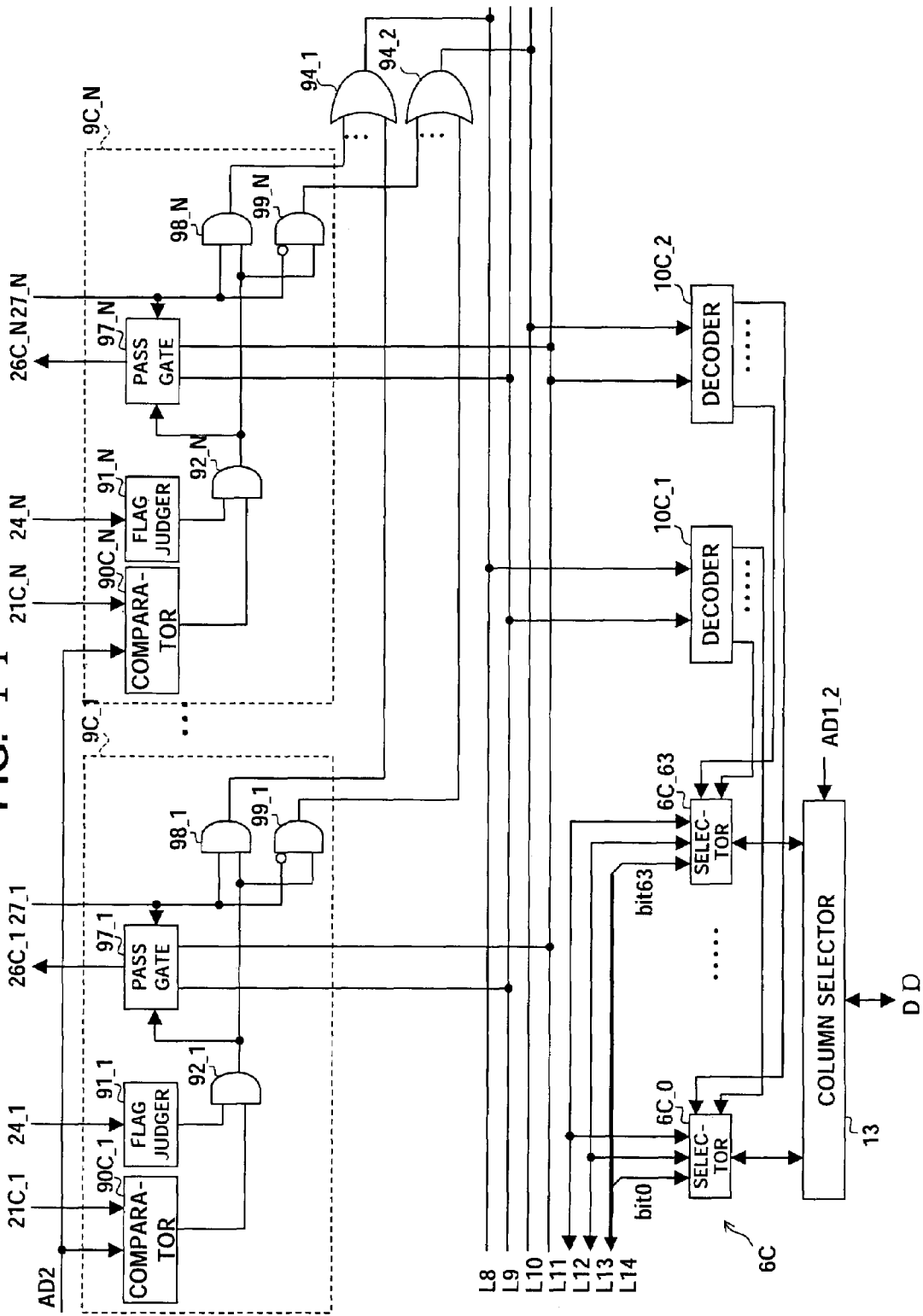
FIG. 14 is a block diagram of an example of the configuration of a comparing/judging unit and a decoder according to an eighth embodiment of the invention.

Further, as shown in FIG. 14, the semiconductor memory device according to the present embodiment has N number of comparing/judging units 9C_1 to 9C_N, OR circuits 94_1 and 94_2 for computing the logical OR of two systems of judgment signals output from these comparing/judging units, and two systems of decoders 10C_1 and 10C_2.

Each comparing/judging unit 9C_i has a comparator 90C_i, a flag judger 91_i, AND circuits 92_i, 98_i, and 99_i, and a pass gate 97_i.

Each comparator 90C_i receives as input 4 bits of address of the row address ADR and 6 bits of address of the column address ADC (hereinafter these two addresses will be described as the address AD2) and compares the input address AD2 and the defective sub-memory region address 21C_i read out from the i-th memory group. When the two addresses coincide, it outputs the signal of "1", while when they do not coincide, it outputs the signal of "0".

Each flag judger 91_i and AND circuit 92_i have functions the same as those of the already explained comparator 90_i. Namely, the flag judger 91_i outputs "1" when the flag data 24_i of the i-th memory group is valid in state, while outputs "0" when it is not valid in state. Each AND circuit 92_i outputs the logical AND of the comparator 90C_i and the flag judger 91_i as the judgment signal. When this judgment signal is "1", the input address is the address of a defective sub-memory region, while when the judgment signal is "0", the input address is the address of a normal sub-memory region.

Each pass gate 97_i has three terminals (the first terminal to the third terminal) and switches the connection configuration of them in accordance with the judgment signal of the AND circuit 92_i. The first terminal is connected to the input/output lines of the defective cell address 26C_i of the i-th memory group. The second terminal is connected to the defective cell address input terminal of the decoder 10C_1 via a common lines L9. The third terminal is connected to the defective cell address input terminal of the decoder 10C_2 via a common lines L11. When the judgment signal of the AND circuit 92_i is "1", the first terminal and the second terminal become conductive and the first terminal and the third terminal are shut. When the judgment signal is "0", the first terminal and the third terminal become conductive and the first terminal and the second terminal are shut.

Each AND circuit 98_i outputs the logical AND of the judgment signal of the AND circuit 92_i and the redundant memory designation data 27_i read out from the i-th memory group as the first judgment signal. Each AND circuit 99_i outputs the logical AND of the judgment signal of the AND circuit 92_i and the signal obtained by inverting the logic of the redundant memory designation data 27_i as the second judgment signal. Accordingly, when the redundant memory designation data 27_i is "1", the first judgment signal becomes equal to the judgment signal of the AND circuit 92_i and the second judgment signal becomes "0". When the redundant memory designation data 27_i is "0", the second judgment signal becomes equal to the judgment signal of the AND circuit 92_i and the first judgment signal becomes "0".

The OR circuit 94_1 outputs the logical OR of the first judgment signals output from the comparing/judging units 9C_1 to 9C_N to the first judgment signal line L8. The OR circuit 94_2 outputs the logical OR of the second judgment signals output from the comparing/judging units 9C_1 to 9C_N to the second judgment signal line L10.

The selector 6C has 64 selectors 6C_0 to 6C_63 corresponding to the 64 bits of input/output lines L14 of the column selector 5C connected to the usually used memory.

Each selector 6C_n (n indicates an integer from 0 to 63) selects one of an input/output line L12 of the column selector 5C connected to the first redundant memory, an input/output line L13 of the column selector 5C connected to the second redundant memory, or the n-th bit signal line of input/output lines L14 of the column selector 5C connected to the usually used memory in response to the decode signal supplied for the selector 6C_n from the decoders 10C_1 and 10C_2, and connects the selected line to the n-th bit signal line of the signal lines D64.

The decoder 10C_1 receives as input the signal of the first judgment signal line L8 and the defective cell addresses output from the second terminals of the pass gates 97_1 to 97_N via the common lines L9 and sets the connection states of the selectors 6C_1 to 6C_N in accordance with this. Namely, when the signal of the first judgment signal line LB is "1", the decode signal is generated so that any bit of the signal lines D64 is connected to the input/output line L12 for the first redundant memory in accordance with the defective cell address input via the common lines L9 and the remaining bits of the signal lines D64 are connected to corresponding bits of input/output lines L14 of the usually used memory (some remaining bits of the signal lines D64 are connected to input/output lines L13 for the second redundant memory depending on the decoding result of the decoder 10C_2).

Further, when the signal of the first judgment signal line L8 is "0", it generates a decode signal so that all bits of the signal lines D64 are connected to corresponding bits of the input/output lines L14 of the usually used memory (some bits of the signal lines D64 are connected to the input/output lines L13 for the second redundant memory depending on the decoding result of the decoder 10C_2).

The decoder 10C_2 receives as input the signal of the second judgment signal line L10 and defective cell addresses output from the third terminals of the pass gates 97_1 to 97_N via the common lines L11 and sets the connection states of the selectors 6C_1 to 6C_N in accordance with this. Namely, when the signal of the second judgment signal line L10 is "1", it generates the decode signal so that any bit of the signal lines D64 is connected to the input/output line L13 of the second redundant memory in accordance with the defective cell address input via the common lines L11 and the remaining bits of the signal lines D64 are connected to the corresponding bits of the input/output lines L14 for the usually used memory (some remaining bits of the signal lines D64 are connected to the input/output lines L12 for the first redundant memory depending on the decoding result of the decoder 10C_1).

Further, when the signal of the second judgment signal line L10 is "0", it generates the decode signal so that all bits of the signal lines D64 are connected to corresponding bits of the input/output lines L14 of the usually used memory (some bits of the signal lines D64 are connected to the input/output lines L12 for the first redundant memory according to the decoding result of the decoder 10C_1).

Next, an explanation will be given of the operation of the semiconductor memory device according to the present embodiment having the above configuration. When the memory address (ADR, ADC) is input together with a control signal instructing writing/reading, the selection operations of the word lines of the row decoders 3 and 7 are executed in parallel, and 1 row's worth of memory of the first memory array 1C and N number of memory groups of the second memory array 2C corresponding to them become accessible via the sense amplifiers.

The column selector 5C selects 66 bits of memory (4 words of sub-memory region+2 bits of redundant memory) in accordance with the 6 bits of address in the column address ADC from among 1 row's worth of memory of the accessible first memory array 1C. The comparing/judging units 9C_1 to 9C_N compare the sub-memory region addresses 21C_1 to 21C_N read out from the memory groups and the input address AD2, judge the flag data 24_1 to 24_N read out from the memory groups, and judge whether or not the input address is an address of a defective sub-memory region based on the results.

The judgment results of the comparing/judging units 9C_1 to 9C_N are distributed to either of two systems in accordance with the values of redundant memory designation data 27_1 to 27_N, that is, which of two redundant memories (the first redundant memory or the second redundant memory) is to be used for repairing the defective memory cells.

For example, when redundant memory designation data 27_i input to the comparing/judging unit 9C_i is set at "1", the first redundant memory is used for the repair of the defective memory cell based on the judgment result. In this case, the judgment signal of an AND circuit 92_i is input to the decoder 10C_1 from the AND circuit 98_i via the OR circuit 94_1 and the common line L8. Further, a defective cell address 26C_i is input to the decoder 10C_1 via the second terminal of the pass gate 97_i and the common line L9. In this case, when the judgment signal of the AND circuit 92_i is "1", one among 64 bits of signal lines D64 designated by the defective cell address 26C_i is connected to the input/output line L12 of the first redundant memory via one of the selectors 6C_1 to 6C_63.

Conversely, when redundant memory designation data 27_i input to the comparing/judging unit 9C_i is set at "0", the second redundant memory is used for the repair of the defective memory cell based on the judgment result. In this case, the judgment signal of the AND circuit 92_i is input to the decoder 10C_2 from the AND circuit 99_i via the OR circuit 94_2 and the common line L10. Further, the defective cell address 26C_i is input to the decoder 10C_2 via the third terminal of the pass gate 97_i and the common lines L9. Then, in this case, when the judgment signal of the AND circuit 92_i is "1", one among 64 bits of signal lines D64 designated by the defective cell address 26C_i is connected to the input/output line L13 of the second redundant memory via one of the selectors 6C_1 to 6C_63.

The column selector 13 selects 16 bits of signal lines from the selection result of the selector 6C based on 2 bits of address and connects this to the data bus DIO. When the connections of the selector 6C and the column selector 13 are finalized, the reading and writing operation with respect to the usually used memory or the redundant memory of the first memory array 1C are carried out.

As explained above, according to the semiconductor memory device of the present embodiment, it is possible to obtain the same effects as those of the semiconductor memory device shown in FIG. 12, and further it becomes possible to repair a plurality of defective memories in one memory region of the first memory array 1C. Accordingly, the probability of repair can be raised even in a memory having many small defects, and the yield can be improved.

Ninth Embodiment

Next, a ninth embodiment of the present invention will be explained.

In the semiconductor memory device according to the present embodiment, defective memory of the first memory array is detected, and information for specifying the defective memory stored in the second memory array is updated in accordance with this detection result.

Figure 15:
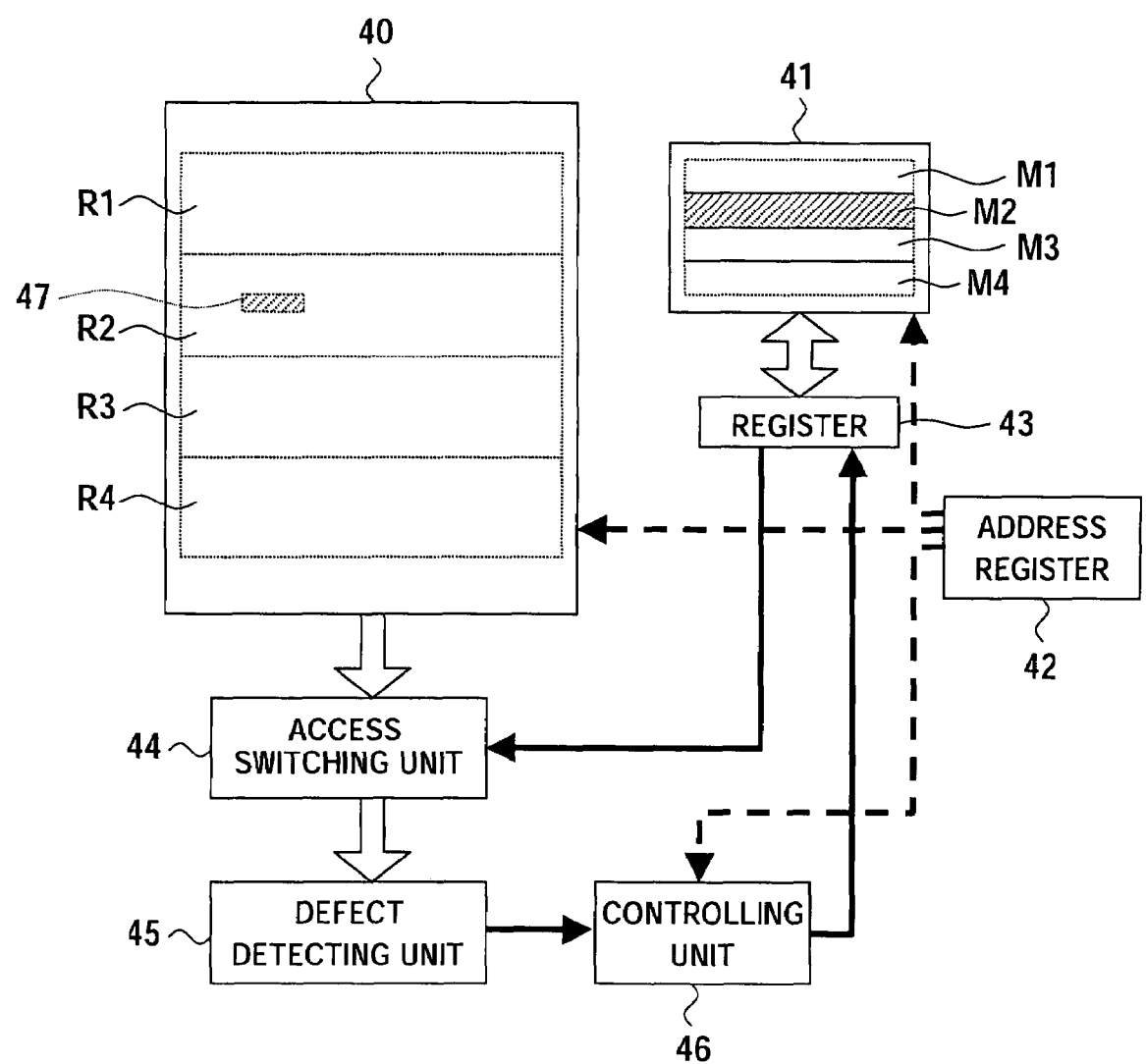
FIG. 15 is a block diagram of an example of the configuration of a semiconductor memory device according to a ninth embodiment of the invention.

FIG. 15 is a block diagram of an example of the configuration of a semiconductor memory device according to the ninth embodiment of the present invention. The semiconductor memory device shown in FIG. 15 has a first memory array 40, a second memory array 41, an address register 42, a register 43, an access switching unit 44, a defect detecting unit 45, and a controlling unit 46. The first memory array 40 is an embodiment of the first memory array in the second aspect of the invention. The second memory array 41 is an embodiment of the second memory array in the second aspect of the invention. The defect detecting unit 45 is an embodiment of the defect detecting unit in the second aspect of the invention. The controlling unit 46 is an embodiment of the controlling unit in the second aspect of the invention.

The first memory array 40 is the main memory portion of the present semiconductor memory device including the usually used memory.

The second memory array 41 stores information for specifying defective memory in each of four memory regions (R1 to R4) obtained by dividing the first memory array. In the example of FIG. 15, it has memory regions M1 to M4 for storing defective memory specifying information concerning the memory regions R1 to R4. Note that the first memory array is divided into a plurality of memory regions using part of the row addresses etc. as in for example the above embodiments.

The address register 42 holds the address of the memory to be accessed when the first memory array 40 is accessed.

The register 43 holds one memory region (M1 to M4) worth of defective memory specifying information read out from the second memory array 41. When a latch type sense amplifier is used in the second memory array 41, it can be used as the register 43 too.

The access switching unit 44 specifies the defective memory based on the defective memory specifying information held in the register 43 and switches access operation so that not illustrated redundant memory is accessed instead of the specified defective memory. Namely, defective memory is not selected and redundant memory is selected to repair any defect. This defective memory repair routine is realized by for example the same method as the above embodiments.

The defect detecting unit 45 detects error included in the data read out after the access switching operation of the access switching unit 44 based on the comparison with for example input data for detecting error. When error is detected, the information etc. concerning the position of any memory cell where error was detected is output to the controlling unit 46.

The controlling unit 46 performs various control and processing concerning the entire operation such as control concerning the reading and writing of the data with respect to the first memory array 40 and the second memory array 41, and the processing for updating the information of the second memory array 41 based on the detection result of the defect detecting unit 45.

Next, an explanation will be given of the operation of the semiconductor memory device shown in FIG. 15 having the above configuration.

When the first memory array 40 is accessed according to an address held in the address register 42, the controlling unit 46 reads out a information for specifying defective memory from the memory region (M1 to M4) on the second memory array 41 corresponding to the memory region (R1 to R4) including the memory to be accessed, and holds the read information in the register 43. For example, when 1 word of data is read out from the memory 47 of the region R2 on the first memory array 40, the information for specifying defective memory in the region R2 is read out from the memory region M2 on the second memory array 41 and holds it in the register 43.

When the defect detecting unit 45 detects a defect of the memory and receives the position information etc. of a memory cell, the controlling unit 46 acquires the address of the defective memory from the address register 42 and newly generates a information for specifying defective memory in the memory region R2 based on the acquired address and the position information from the defect detecting unit 45. Then, the controlling unit 46 updates the information held in the register 43 based on this generated information. For example, when the flag data of each memory group stored in the register 43 is checked and there is a memory group where the flag data is invalid in state (unused), the controlling unit 46 writes the information for specifying defective memory into the register corresponding to the memory group and, at the same time, changes the invalid state of the flag data to the valid state (use). When the register 43 is updated, the controlling unit 46 writes back all data after the update into corresponding memory region of the second memory array 41.

As explained above, according to the semiconductor memory device shown in FIG. 15, defective memory of the first memory array 40 is detected in accordance with the error of the data read out after the access switching operation, and the information for specifying defective memory stored in the second memory array 41 is updated based on this detection result. In this way, it is possible to automatically detect any defective memory inside the memory device and update the information for specifying defective memory capable of repairing the detected defective memory, therefore it becomes possible to easily repair a new defective memory occurring due to for example aging of the device after shipping the product.

It is also possible to detect error of the data in the defect detecting unit 45 by attaching an error detecting code such as parity data to the data of the first memory array 40 and utilize this. When detecting error and updating the defective memory specifying information explained above whenever for example data is read out, it becomes possible to automatically repair a memory defect occurring after shipping due to aging etc. without burdening the user.

For example, when the data read out in the first memory array 40 is comprised of (64+7) bits and 7 bits are used as the parity, the defect detecting unit 45 can detect and correct 1 bit of error. If further defect of the memory occurs in the state where 1 bit of error has been corrected, this defect cannot be repaired by the conventional method of correcting error with only parity. On the other hand, when automatically repairing a detected error part by replacement with a redundant memory as described above, even if a defect occurs again, the error can be corrected by the parity again, therefore the defect can be repaired. In this case, defects can be repeatedly repaired so far as there is space in the redundant memory and the memory for storing the information for specifying defective memory.

Further, the above function of automatically repairing defective memory specifying information is very useful particularly when repairing a large amount of small defects. For example, it is possible to generate the information for specifying defective by utilizing the present function before the shipping. By this, the time and the cost taken for detecting and repairing defects can be greatly reduced.

The conventional simplest routine for defect detection and repair is the application of the routine used in the write verification etc. in the flash memory and is as follows:

(1) A input data is first stored in a register at the time of writing the input data to a memory array.

(2) After the input data is written into the memory array, then the same location is immediately read out.

(3) The input data and the output data are compared, and error is detected.

(4) Any defect is additionally repaired based on the detected error.

However, it is difficult to detect defects efficiently and sufficiently by the above technique. For example, small defects occur along with holding data. In order to detect this, a constant standing period is necessary after holding, but with this method, it becomes necessary to let data stand whenever 1 word is written, so an enormous test time becomes necessary. Further, there are also memory defects that cause erroneous writing into adjacent cells at the time of writing. Such defects cannot be detected by the method of checking memory cells one by one. In addition, a variety of tests become necessary in accordance with various cases of defects, but it is difficult to cope with such tests flexibly by the above technique.

If using the test technique of using the semiconductor memory device shown in FIG. 15 to detect defective memory and automatically generate the information for specifying it to deal with such problems of the prior art, it is possible to flexibly cope with all test sequences.

Figure 16:
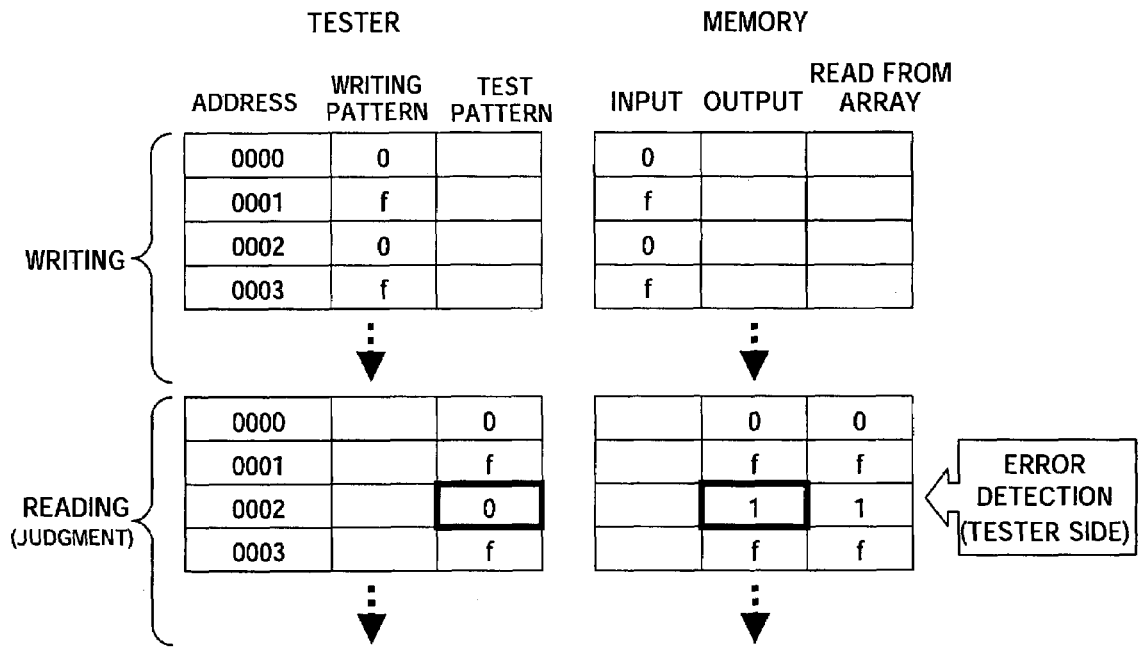
FIG. 16 is a view illustrating an example of the routine of a conventional function test.
Figure 17:
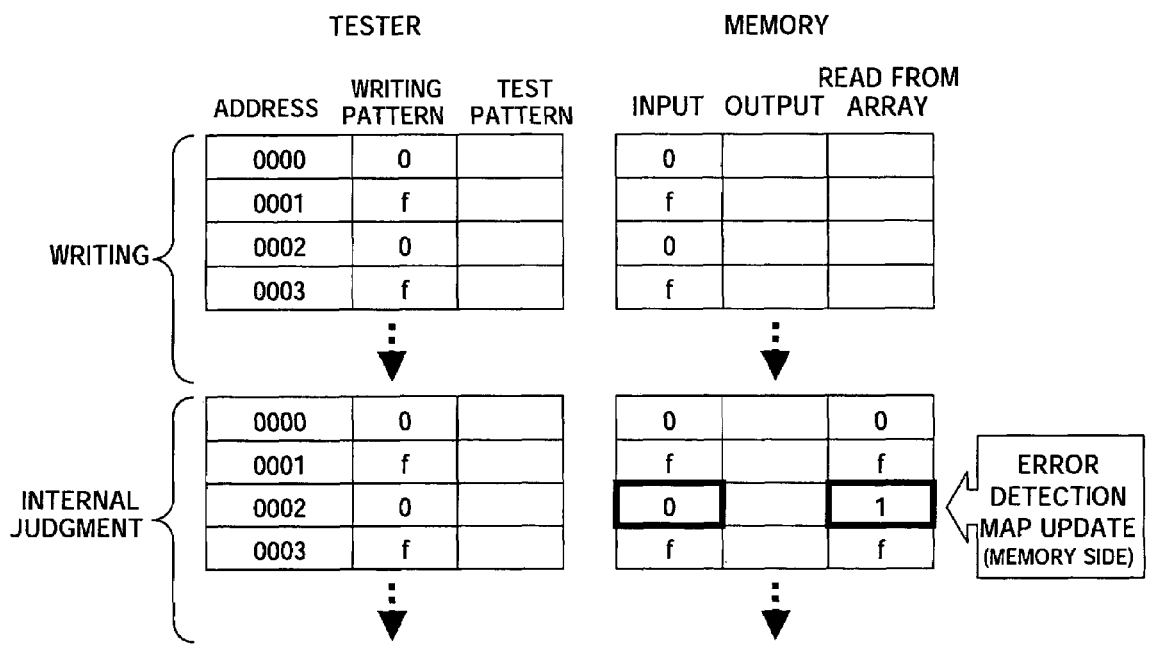
FIG. 17 is a view illustrating an example of the routine of the function test using the semiconductor memory device shown in FIG. 15.

FIG. 16 is a view illustrating an example of the routine of a conventional function test, while FIG. 17 is a view illustrating an example of the routine of a function test using the semiconductor memory device shown in FIG. 15.

In the conventional function test shown in FIG. 16, the preparation of a write pattern at the time of writing, the preparation of a test pattern (correct) equal to the write pattern at the time of reading, and the comparison the data read out from the semiconductor memory device with the test pattern are carried out at the tester side.

On the other hand, in the function test shown in FIG. 17, in place of the conventional read operation, the test pattern is supplied from the tester side to the semiconductor memory device. In the semiconductor memory device, any defect is detected by the comparison between the test pattern supplied from the tester and the data read out from the memory array, and the information for specifying defective memory stored in the semiconductor memory device is updated in accordance with the comparison result.

Namely, when a predetermined signal instructing the start of a defect detection operation is input from the tester, the controlling unit 46 reads out the data stored in memory of the first memory array 40 in a predetermined sequence. At this time, data found to be "correct" is sequentially input to the memory device from the tester. The defect detecting unit 45 sequentially compares the data read out from the first memory array 40 and the test pattern from the tester and detects defective memory included in the first memory array 40 based on this comparison result. When the defect detecting unit 45 detects defective memory, the information for specifying the detected defective memory is written into the second memory 41 by the controlling unit 46.

In this way, the troublesome process performed outside of the semiconductor memory device for detecting and repairing defects is simplified, so the time and the cost required for the process can be reduced. Further, the complex processing on the tester side is unnecessary, therefore it is possible to apply this to the conventional function test as it is.

Note that the test mode for detecting defects and updating the information for specifying defective memory inside the semiconductor memory device in this way must be distinguished from the normal operation mode. Therefore it is possible to for example provide a test pin in the semiconductor memory device and supply an appropriate signal to the test pin to execute the test mode. It is also possible to input a signal from the conventional input pins by a special combination so as to execute the text mode.

Further, it is also possible to provide a means for notifying the existence of error or whether or not the information for specifying defective memory was updated through a specific output pin etc. of the semiconductor memory device from the memory side to the tester side.

Further, the above repair of defects is preferably performed after manually repairing any large defects. The repair unit for repairing large defects is for example unit of bit line or word line. By this, the automatic defect repair technique explained above is applied for this repair, and the consumption of large amount of memories used for repairing small defects can be prevented.

For the repair of such large defect, it is possible to apply the repair technique using fuses etc. as the means for storing the defect map for each bit line or word line.

Namely, the semiconductor memory device shown in FIG. 15 can be further provided with a second redundant memory having equivalent memory size to that of memories connected to one or more bit lines or one or more word lines on the first memory array 41, a data storing unit for storing information to specify the bit line or word line connected to defective memory on the first memory array 41, a second access switching unit for specifying the bit line or word line connected to defective memory based on the information stored in the data storing unit and switching an access operation so that the second redundant memory is accessed instead of memories connected to the specified bit line or word line.

After storing the information of the bit line and word line in which large defects occurs in this data storing unit in advance, by applying the above automatic defect repair technique, it is possible to avoid the problem of consuming a large amount memories used for repairing small defects.

Further, the automatic defect repair technique is not limited to the configuration of the semiconductor memory device shown in FIG. 15. Namely, it can also be applied to various semiconductor memory devices having a memory array, at least one redundant memory which can replace memory on this memory array, a data storing means for storing information for specifying defective memory included in the memory array, and an access switching means for specifying defective memory based on the information stored in the data storing means and switching an access operation so that the redundant memory is accessed instead of the specified defective memory.

While some embodiments of the present invention were explained above, the present invention is not limited to these embodiments. Various modifications are possible.

For example, in the above embodiments, the example was shown wherein the redundant memory was included in one of the first memory array or the second memory array, but the present invention is not limited to this. It is also possible to provide the redundant memories in for example a third memory array independent from these memory arrays. Each redundant memory may corresponds to each of memory regions which are obtained by dividing the first memory array for one or more word lines, and may becomes accessible when a memory address for accessing a memory included in the corresponding memory region is input.

In the semiconductor memory device according to the fifth and sixth embodiments, the first memory array 1B has only one redundant memory for each word of memory accessed by an input address, but may have a plurality of redundant memories too. The semiconductor memory device in this case has substantially the same configuration as the semiconductor memory device shown in FIG. 12 or FIG. 14 minus the column selector 13 except for the point that the bit lengths of signals are different.

Namely, in this case, each memory group includes memory for storing the redundant memory designation data. The controlling unit 15 reads out the redundant memory designation data when the memory address is input. The comparing/judging unit and the selector switch an access operation so that redundant memory designated by the redundant memory designation data is accessed instead of a memory cell designated by the defective cell address when it is judged that the input address is the address of defective memory.

Summarizing the effects of the invention, defects can be repaired efficiently by using the limited redundant memory while suppressing any drop of the access speed accompanying repair of defects of the memory.

What is claimed is:

1. A semiconductor memory device comprising:
    a first addressable memory array having a plurality of memory regions obtained by dividing the first memory array by one or more word lines;
    a second addressable memory array having a plurality of memory groups for storing defective memory address information, wherein each memory group corresponds to a memory region and stores information that designates a defective memory included in the corresponding memory region;
    a controlling unit for causing the second addressable memory array to output the defective memory address information stored in the memory group corresponding to one of said memory regions whenever a memory address for accessing a memory included in that memory region is input;
    at least one redundant memory;
    an access switching unit for specifying a defective memory according to the defective memory address information read out from said second memory array and switching an access operation so that said redundant memory is accessed instead of the specified defective memory; and
    a plurality of redundant memories, each of which corresponds to the each memory region on said first memory array and becomes accessible when a memory address for accessing a memory included in the corresponding memory region is input, and
    wherein said controlling unit executes processing for causing said first memory array, said second memory array, and said redundant memory to output the respective data stored therein in parallel when the memory address for accessing a memory on said first memory array is input.

2. The semiconductor memory device of claim 1, wherein said access switching unit judges whether or not an input memory address is an address of defective memory according to a comparison between the input memory address and a defective memory address information output from said second memory array in accordance with the input memory address, and switches an access operation so that the redundant memory is accessed instead of a defective memory when judging that the input memory address is an address of the defective memory.

3. The semiconductor memory device of claim 2, wherein:
    said redundant memory is included in the first memory array;
    at least one of said redundant memories connected to the same word line of a first memory on said first memory array becomes accessible when the first memory becomes accessible in accordance with the input memory address;
    said second memory array can store information designating one or more defective memory addresses for each memory region on said first memory array; and
    said access switching unit judges whether or not the input memory address is an address of defective memory according to a comparison between the input memory address and one or more defective memory addresses designated by the information output by said second memory array in accordance with the input memory address, and switches an access operation so that the redundant memory connected to the same word line of a defective memory is accessed instead of the defective memory when judging that the input memory address is an address of the defective memory.

4. The semiconductor memory device of claim 2, wherein:
    said each redundant memory corresponds to each of a plurality of sub-memory regions obtained by further dividing the memory region on said first memory array;
    a redundant memory corresponding to the sub-memory region including a first memory becomes accessible when the first memory becomes accessible in accordance with the input memory address; and
    said access switching unit switches an access operation so that the redundant memory corresponding to a sub-memory region including a defective memory is accessed instead of the defective memory when judging that the input memory address is an address of the sub-memory region including the defective memory.

5. A semiconductor memory device comprising:
    a first addressable memory array comprising a plurality of memory words, each word being specified by a word address comprising M word bits $\{w_1, \ldots, w_M\}$, where M is an integer, wherein said memory words are organized into word lines specified by N word line bits, where N is an integer less than or equal to M, such that the word addresses for every memory word in any one word line have N word line bits $\{w_1, \ldots, w_N\}$ in common, and said word lines are organized into memory regions specified by L memory region bits, where L is an integer less that or equal to N, such that the word addresses for every memory word line in any one memory region have L memory region bits $\{w_1, \ldots, w_L\}$ in common;

a second addressable memory array comprising a plurality of memory groups, each group being specified by a group address comprising L group bits $\{g_1, \ldots, g_L\}$, wherein each group corresponds to the memory region having memory region bits $\{w_1, \ldots, w_L\}$ equal to its group address, and each group stores (N−L) bits of region data $\{d_{L+1}, \ldots, d_N\}$ designating a word line within the corresponding memory region having a defective memory;

at least one redundant memory; and a controlling unit for causing the second addressable memory array to output the defective memory address information stored in the memory group corresponding to one of said memory regions only when a word address for accessing any of the memory words included in that memory region memory region is input, wherein said controlling unit executes processing for causing said first memory array, said second memory array, and said redundant memory to output the respective data stored therein in simultaneously parallel when the memory address for accessing a memory on said first memory array is input.

6. The semiconductor device of claim 5, further comprising:

an access switching unit for specifying a defective memory according to the defective memory address information read out from said second memory array and switching an access operation so that said redundant memory is accessed instead of the specified defective memory.

7. The semiconductor device of claim 5, further wherein M is 20, N is 12, and L is 8.

8. The semiconductor device of claim 5, further wherein each memory group also stores (M−N) bits of column data $\{d_{N+1}, \ldots, d_M\}$ designating a memory word having a defective memory within the said designated word line.

9. The semiconductor device of claim 8, wherein the memory word designated by the region data bits $\{d_{L+1}, \ldots, d_N\}$ and column data bits $\{d_{N+1}, \ldots, d_M\}$ stored in the memory group designated by group bits $\{g_1, \ldots, g_L\}$ is specified by memory word address $\{g_1, \ldots, g_L, d_{L+1}, \ldots, d_N, d_{N+1}, \ldots, d_M\}$.

* * * * *